United States Patent [19]
Goto

[11] Patent Number: 6,127,825
[45] Date of Patent: Oct. 3, 2000

[54] METHOD OF PHASE SHIFT MEASUREMENT, METHOD OF PHASE CORRECTION, AND MRI APPARATUS

[75] Inventor: Takao Goto, Tokyo, Japan

[73] Assignee: GE Yokogawa Medical Systems, Limited, Tokyo, Japan

[21] Appl. No.: 08/858,378

[22] Filed: May 19, 1997

[30] Foreign Application Priority Data

Jul. 11, 1996 [JP] Japan .................................. 8-182099
Mar. 14, 1997 [JP] Japan .................................. 9-061528

[51] Int. Cl.$^7$ ...................................................... G01V 3/00
[52] U.S. Cl. ........................................... 324/307; 324/309
[58] Field of Search ................................. 324/309, 307, 324/306, 312, 314, 300

[56] References Cited

U.S. PATENT DOCUMENTS

| | | |
|---|---|---|
| 5,262,725 | 11/1993 | Cuppen . |
| 5,450,010 | 9/1995 | Van der Meulen . |
| 5,455,512 | 10/1995 | Groen et al. ............................ 324/309 |

FOREIGN PATENT DOCUMENTS

| | | |
|---|---|---|
| 492706 | 7/1992 | European Pat. Off. . |
| 577188 | 1/1994 | European Pat. Off. . |
| 595301 | 5/1994 | European Pat. Off. . |
| 735379 | 10/1996 | European Pat. Off. . |

OTHER PUBLICATIONS

"Fast Spin Echo Prescan For Artifact Reduction" R.Scott Hinks Jim Hohli, and Sheil Washburn. p632.
"Reduction of Phase Error Ghosting Arifacts in Thin Slice Fast Spin–Echo Imaging" Xin Wan, Dennis L. Parker, James N.Lee, Henry R. Buswell, Grant T. Gulber, pp 632–638.

*Primary Examiner*—Louis Arana
*Attorney, Agent, or Firm*—Moonray Kojima

[57] ABSTRACT

For the accurate measurement of the phase shift of echos caused by the inference of the eddy current and residual magnetization attributable to the encode gradient and the like, the measuring process includes the steps of emitting an excitation pulse R, emitting an inversion pulse P1, applying an encode gradient gyn to the phase axis, applying a read gradient gxr, which is the former half of the usual read gradient, to the read axis, applying a rewind gradient gyrn in which a compensation pulse gypn is put to the phase axis, emitting an inversion pulse P2, applying a dephaser gradient gywdn to the phase axis, sampling data from the echo echo2 while applying a readout gradient gywn to the phase axis, evaluating the phase shift value of the echo2 caused by the influence of the encode gradient gyn and rewind gradient gyrn based on phase data resulting from the first-order Fourier transform for the sampled data, determining the correction value from the resulting phase shift value, revising the compensation pulse gypn with the correction value, and repeatting these operations an intended number of times while altering the encode gradient gyn.

17 Claims, 26 Drawing Sheets

METHOD OF PHASE SHIFT MEASUREMENT, METHOD OF PHASE CORRECTION, AND MRI APPARATUS

BACKGROUND OF THE INVENTION

1. Field of the Invention

The present invention relates to a method of phase shift measurement, method of phase shift correction, and magnetic resonance imaging (MRI) apparatus. More particularly, the invention relates to a method of measuring the phase shift of echos caused by the influence of the eddy current and residual magnetization attributable to the preceding encode gradient, etc., a method of correcting the phase shift of echos, and an MRI apparatus which carries out these methods.

2. Description of the Prior Art

The split echo train method is intended to divide multiple echos of an echo train into former-part echos and latter-part echos and produce a first image (proton weighted image) from the former-part echos and a second image (T2 weighted image) from the latter-part echos.

The pulse sequence of the split echo train method has a large amplitude of the encode gradient on its waveform, with its duration being reduced accordingly, in order to reduce the cycle time.

The same technique is used in the conventional high-speed spin echo (SE) method, i.e., it has a pulse sequence including an encode gradient of a large amplitude and short duration in order to reduce the cycle time.

However, the eddy current emerging in the conductor around the gradient coil increases as the amplitude of gradient pulse increases and its duration decreases. The eddy current effects the increase of the phase shift among echos, and the phase shift produces ghost images in the phase axis direction on the image, i.e., creation of artifacts.

A technique for reducing such ghost images is proposed in publication: Proc. SMR, p. 634, 1995, by R.Scott Hinks et al., in which pre-scan data is sampled without applying the encode gradient at pre-scanning, the sampled data is rendered the first-order Fourier transform along the frequency axis of the K-space thereby to obtain phase data, and the offset phase for the read gradient and inversion pulse P is corrected based on the phase data for the main scanning of imaging.

A method of phase correction process is proposed in publication: Mag. Reso. in Med., pp.632–638, 1995, by Xin Wan, Dennis L. Parker, et al., in which after the main scanning of imaging, correction data is sampled without applying the encode gradient, and the phase correction process is implemented based on the correction data at the calculation of image rearrangement.

MRI apparatus based on the permanent magnet also involve the above-mentioned problem of phase shift caused by the eddy current and, in addition, the problem of phase shift caused by the residual magnetization. Specifically, the residual magnetization emerging in the magnetic rectifying plates, for example, increases and affects the phase shift significantly as the pulse amplitude increases.

However, in the foregoing prior art methods which sample correction data without applying the encode gradient, the correction data does not include the influence of the residual magnetization, and therefore these methods cannot correct the phase shift caused by the influence of the residual magnetization.

SUMMARY OF THE INVENTION

A first object of the present invention is to provide a method of phase shift measurement for measuring the phase shift of echos caused by the influence of the eddy current and residual magnetization attributable to the preceding encode gradient, etc.

A second object of the present invention is to provide a method of phase shift correction for correcting the phase shift of echos thereby to prevent the deterioration of image cause by the influence of the eddy current and residual magnetization attributable to the preceding encode gradient, etc.

A third object of the present invention is to provide an MRI apparatus which carries out the above-mentioned phase shift measuring method and phase shift correcting method.

In a first aspect, the present invention resides in a method of phase shift measurement which comprises the steps of emitting an excitation pulse, emitting an inversion pulse, applying an encode gradient to the phase axis, applying a read gradient to the read axis and applying a rewind gradient to the phase axis, with these operations being implemented once or more, and subsequently emitting an inversion pulse, applying a dephaser gradient to the phase axis, sampling data from an echo while applying a readout gradient to the phase axis, and evaluating the phase shift caused by the influence of the encode gradient based on phase data resulting from the first-order Fourier transform for the sampled data.

The phase shift measuring method of the first aspect samples data from an echo while applying the dephaser gradient and readout gradient to the phase axis, but without applying a read gradient. The sampled data align on the trajectory along the phase axis in the K-space, and accordingly the 1st-order phase shift (a phase shift component which exhibits the 1st-order variation of the phase shift value along the phase axis of the K-space) can be known accurately from the phase data resulting from the first-order Fourier transform for the sampled data. Accordingly, by sampling data in this manner following the application of the encode gradient, read gradient and rewind gradient, it is possible to measure accurately the phase shift caused by the influence of the eddy current and residual magnetization attributable to the encode gradient, etc.

A first variant aspect, which is derived from the phase shift measuring method of the first aspect, includes the steps of sampling data by applying a dephaser gradient and readout gradient, with their polarity being inverted, and evaluating the phase shift caused by the influence of the encode gradient based on phase data resulting from the first-order Fourier transform for the sampled data and the phase data obtained prior to the polarity inversion.

The eddy current is also created by the dephaser gradient, and therefore the measurement result can possibly be inconsistent with that of main scanning unless the influence of dephaser gradient is eliminated. The eddy current created by the dephaser gradient acts in the same direction irrespective of the polarity of dephaser gradient in regard to the 1st-order phase shift, whereas the phase shift caused by the preceding encode gradient, etc. acts in the opposite direction when the dephaser gradient has its polarity inverted. Accordingly, by conducting the differential process for the data with and without inversion of the polarity of dephaser gradient, the influence of the eddy current caused by the dephaser gradient can be eliminated and the phase shift attributable to the preceding encode gradient, etc. can be measured accurately.

In a second aspect, the present invention resides in a method of phase shift measurement which comprises the steps of emitting an excitation pulse, emitting an inversion pulse, applying an encode gradient to the phase axis, applying a read gradient to the read axis and applying a rewind gradient to the phase axis, with these operations being repeated twice or more, and subsequently emitting an inversion pulse, applying a dephaser gradient to the phase axis, sampling first data from an echo while applying a readout gradient to the phase axis, applying a rephaser gradient to the phase axis, and subsequently emitting an inversion pulse, applying a dephaser gradient to the phase axis, sampling second data from another echo while applying a readout gradient to the phase axis, and evaluating the phase shift caused by the influence of the encode gradient based on phase data resulting from the first-order Fourier transform for the first data and phase data resulting from the first-order Fourier transform for the second data.

Even if the encode gradient is "0", the phase shift is not "0" and an offset phase shift component exists. The offset phase shift component has the same direction for the first and second data, whereas the phase shift attributable to the preceding encode gradient, etc. has opposite directions between the first and second data due to the emission of inversion pulse between the sampling of the first and second data. Accordingly, by conducting the differential process for the first and second data, the offset phase shift component can be eliminated and the phase shift attributable to the preceding encode gradient, etc. can be measured accurately.

A second variant aspect, which is derived from the phase shift measuring method of the second aspect, includes the steps of sampling the first and second data by applying a dephaser gradient, readout gradient and rephaser gradient, with their polarity being inverted, and evaluating the phase shift caused by the influence of the encode gradient based on phase data resulting from the first-order Fourier transform for the sampled data and the phase data obtained prior to the polarity inversion.

The eddy current is also created by the dephaser gradient and rephaser gradient, and therefore the measurement result can possibly be inconsistent with that of main scanning unless their influence is eliminated. The eddy current created by the dephaser gradient and rephaser gradient acts in the same direction irrespective of the polarity of dephaser gradient and rephaser gradient in regard to the 1st-order phase shift, whereas the phase shift caused by the preceding encode gradient, etc. acts in the opposite direction when the dephaser gradient has its polarity inverted. Accordingly, by conducting the differential process for the data with and without inversion of the polarity of dephaser gradient and rephaser gradient, the influence of the eddy current caused by the dephaser gradient and rephaser gradient can be eliminated and the phase shift attributable to the preceding encode gradient, etc. can be measured accurately.

A third variant aspect, which is derived from the phase shift measuring methods of the first aspect through the second variant aspect, includes the step of applying a crusher gradient to the slice axis for the elimination of stimulated echos.

Overlapping of stimulated echos on the echos, with which phase shift measurement is intended, precludes the accurate measurement of phase shift. Application of a crusher gradient to the slice axis thereby to eliminate stimulated echos enables the accurate measurement of phase shift.

In a third aspect, the present invention resides in a method of phase shift measurement which comprises the steps of emitting an excitation pulse, emitting an inversion pulse, applying an encode gradient to the phase axis, applying a read gradient to the read axis and applying a rewind gradient to the phase axis, with these operations being implemented once or more, and subsequently emitting an inversion pulse, sampling data from an echo while applying a read gradient to the read axis, but without applying a gradient to the phase axis, and evaluating the 0th-order phase shift caused by the influence of the encode gradient based on phase data resulting from the first-order Fourier transform for the sampled data.

Although the phase shift measuring methods of the first aspect through the third variant aspect can measure the 0th-order phase shift, the dephaser gradient and readout gradient can possibly affect the 0th-order phase shift. The phase shift measuring method of the third aspect, which does not apply a gradient to the phase axis, can evaluate the 0th-order phase shift accurately.

In a fourth aspect, the present invention resides in a method of phase shift measurement which comprises the steps of emitting an excitation pulse, emitting an inversion pulse, applying an encode gradient to the phase axis, applying a read gradient to the read axis and applying a rewind gradient to the phase axis, with these operations being repeated twice or more, and subsequently emitting an inversion pulse, sampling first data from an echo while applying a read gradient to the read axis, but without applying a gradient to the phase axis, and subsequently emitting an inversion pulse, sampling second data from another echo while applying a read gradient to the read axis, but without applying a gradient to the phase axis, and evaluating the 0th-order phase shift caused by the influence of the encode gradient based on phase data resulting from the first-order Fourier transform for the first data and phase data resulting from the first-order Fourier transform for the second data.

Even if the encode gradient is "0", the 0th-order phase shift is not "0" and an offset phase shift component exists. The offset phase shift component has the same direction for the first and second data, whereas the phase shift attributable to the preceding encode gradient, etc. has opposite directions between the first and second data due to the emission of inversion pulse between the sampling of the first and second data. Accordingly, by conducting the differential process for the first and second data, the offset phase shift component can be eliminated and the phase shift attributable to the preceding encode gradient, etc. can be measured accurately. Although the phase shift measuring methods of the first variant aspect can measure the 0th-order phase shift, the dephaser gradient and readout gradient can possibly affect the 0th-order phase shift. The phase shift measuring method of the fourth aspect, which does not apply a gradient to the phase axis, can evaluate the 0th-order phase shift accurately.

In a fifth aspect, the present invention resides in a method of phase shift correction categorized to be the split echo train method which comprises the steps of emitting an excitation pulse, emitting a j-th inversion pulse, applying a j-th encode gradient to the phase axis, sampling data from a j-th echo while applying a read gradient to the read axis, and applying a j-th rewind gradient to the phase axis, with these operations being repeated for j=1,2, . . . , N, and producing a first image based on data sampled from the former-part echos, and producing a second image based on data sampled from the latter-part echos, wherein a compensation pulse for correcting the 1st-order phase shift of the latter-part echos caused by the influence of the former-part encode gradient and rewind gradient is put in the encode gradient before the last former-part echo, or added at one or both of the points immediately preceding and following the encode gradient, or put in the rewind gradient after the last former-part echo, or added at one or both of the points immediately preceding and following the rewind gradient.

The phase shift correction method of the fifth aspect puts in the compensation pulse at the last encode gradient or rewind gradient of the former part, and it can prevent the dephaser component caused by the former-part encode gradient, etc. from creating a large phase shift relative to the latter-part echos. Consequently, this method is capable of preventing the deterioration of the second image.

A fourth variant aspect, which is derived from the phase shift correction method of the fifth aspect, includes the step of determining the correction value of the compensation pulse based on the phase shift value measured by the phase shift measuring method of any of the first aspect through the third variant aspect.

The phase shift correction method of the fourth variant aspect determines the correction value based on the phase shift value measured by the phase shift measuring method of any of the first aspect through the third variant aspect, and it can prevent accurately the dephaser component caused by the former-part encode gradient, etc. from creating a large phase shift relative to the latter-part echos. Consequently, this method is capable of preventing the deterioration of the second image properly.

A fifth variant aspect, which is derived from the phase shift correction method of the fourth variant aspect, includes the steps of separating the former-part encode gradients with different types of polarity pattern into separate groups, determining the correction value for one or more encode gradients that represent groups by measuring the phase shift value based on the phase shift measuring method of any of the first aspect through the third variant aspect, and determining the correction value for encode gradients that are not of the groups based on the calculation for the determined correction value of the same group or based on the intact use of the determined correction value.

If the former-part encode gradients have different types of polarity pattern, the resulting eddy current and residual magnetization will vary and the phase shift caused by their influence will also vary. On this account, the phase shift correction method of the fifth variant aspect measures the phase shift values for the former-part encode gradients of different polarity pattern types indivisually by the phase shift measuring method of any of the first aspect through the third variant aspect, whereas for the former-part encode gradients of the same polarity pattern type, it calculates (e.g., proportional calculation) the phase shift value from the result the of measurement or uses the result intact. Consequently, this method is capable of balancing the reduction of pre-scanning time and the accuracy of correction.

In a sixth aspect, the present invention resides in a method of phase shift correction categorized to be the split echo train method which comprises the steps of emitting an excitation pulse, emitting a j-th inversion pulse, applying a j-th encode gradient to the phase axis, sampling data from a j-th echo while applying a read gradient to the read axis, and applying a j-th rewind gradient to the phase axis, with these operations being repeated for j=1,2, . . . , N, and producing a first image based on data sampled from the former-part echos, and producing a second image based on data sampled from the latter-part echos, wherein the offset phase for correcting the 0th-order phase shift of the latter-part echos caused by the influence of the former-part encode gradient and rewind gradient is provided for the latter-part inversion pulse, or provided for the echo detection phase, or provided for both.

The phase shift correction method of the sixth aspect emits the latter-part inversion pulse with the offset phase, or provides the offset phase at the phase detection of the received echo, or implements both of them, and it can prevent the latter-part echos from creating a 0th-order phase shift. Consequently, this method is capable of preventing the deterioration of the second image.

A sixth variant aspect, which is derived from the phase shift correction method of the sixth aspect, includes the step of determining the offset phase based on the 0th-order phase shift measured by the phase shift measuring method of the third aspect or fourth aspect.

The phase shift correction method of the sixth variant aspect determines the offset phase based on the phase shift value which is measured accurately by the phase shift measuring method of the third aspect or fourth aspect, and it can prevent accurately the latter-part echos from creating a 0th-order phase shift. Consequently, this method is capable of preventing the deterioration of the second image properly.

A seventh variant aspect, which is derived from the phase shift correction method of the sixth variant aspect, includes the step of separating the former-part encode gradients with different types of polarity pattern into separate groups, determining the offset phase for one or more encode gradients that represent groups by measuring the phase shift value based on the phase shift measuring method of the third aspect or fourth aspect, and determining the offset phase for encode gradients that are not of the groups based on the calculation for the determined offset phase of the same group or based on the intact use of the determined offset phase.

If the former-part encode gradients have different types of polarity pattern, the resulting eddy current and residual magnetization will vary and the 0th-order phase shift caused by their influence will also vary. On this account, the phase shift correction method of the seventh variant aspect measures the 0th-order phase shift values for the former-part encode gradients of different polarity pattern types individually by the phase shift measuring method of the third aspect or fourth aspect, whereas for the former-part encode gradients of the same polarity pattern type, it calculates (e.g., proportional calculation) the phase shift value from the result of measurement or uses the result intact. Consequently, this method is capable of balancing the reduction of pre-scanning time and the accuracy of correction.

In a seventh aspect, the present invention resides in a method of phase shift correction categorized to be the high-speed split echo train method which comprises the steps of emitting an excitation pulse, emitting an inversion pulse, applying an encode gradient to the phase axis, sampling data from an echo while applying a read gradient to the read axis, and applying a rewind gradient to the phase axis, with these operations being repeated multiple times, and producing an image based on the sampled data, wherein a compensation pulse for correcting the 1st-order phase shift of the latter-part echos caused by the influence of the preceding encode gradient and rewind gradient is put in each encode gradient, or added at one or both of the points immediately preceding and following each encode gradient, or put in each rewind gradient, or added at one or both of the points immediately preceding and following each rewind gradient.

The phase shift correction method of the seventh aspect puts in the compensation pulse at each encode gradient or rewind gradient, and it can prevent the dephaser component caused by the former-part encode gradient, etc. from creating a phase shift in the successive echos. Consequently, this method is capable of preventing the deterioration of the second image.

An eighth variant aspect, which is derived from the phase shift correction method of the seventh aspect, includes the step of determining the correction value of the compensation pulse based on the phase shift value measured by the phase shift measuring method of the first aspect or the first variant aspect.

The phase shift correction method of the eighth variant aspect determines the correction value based on the phase shift value which is measured accurately by the phase shift measuring method of the first aspect or the first variant aspect, and it can prevent the phase shift accurately. Consequently, this method is capable of preventing the deterioration of image properly.

A ninth variant aspect, which is derived from the phase shift correction method of the eighth variant aspect, includes the steps of separating the encode gradients with different types of polarity pattern into separate groups, determining the correction value for one or more encode gradients that represent groups by measuring the phase shift value based on the phase shift measuring method of the first aspect or the first variant aspect, and determining the correction value for encode gradients that are not of the groups based on the calculation for the determined correction value of the same group or based on the intact use of the determined correction value.

If the encode gradients have different types of polarity pattern, the resulting eddy current and residual magnetization will vary and the phase shift caused by their influence will also vary. On this account, the phase shift correction method of the ninth variant aspect measures the phase shift values for the encode gradients of different polarity pattern types indivisually by the phase shift measuring method of the first aspect or the first variant aspect, whereas for the encode gradients of the same polarity pattern type, it calculates (e.g., proportional calculation) the phase shift value from the result the of measurement or uses the result intact. Consequently, this method is capable of balancing the reduction of pre-scanning time and the accuracy of correction.

A tenth variant aspect, which is derived from the phase shift correction method of the eighth aspect or the ninth variant aspect, includes the steps of applying the dephaser gradient to the phase axis, instead of applying the second read gradient of the pulse sequence of the high-speed spin echo method for imaging, sampling data from an echo while applying a read gradient to the phase axis, and determining the compensation pulse for the second echo from the data, with these operations being repeated for the third and successive echos, thereby determining the compensation pulses for all echos.

The phase shift correction method of the tenth variant aspect uses the pulse sequence of pre-scanning which differ at minimum from the pulse sequence of the main scanning for imaging to determine the compensation pulse for each echo indivisually, and although it takes a longer pre-scanning time, this method has the enhanced accuracy of correction.

In an eighth aspect, the present invention resides in an MRI apparatus which comprises an RF pulse emission means, a gradient magnetic field application means, an NMR signal reception means, and a phase shift correction value determining means which operates in the steps of emitting an excitation pulse, emitting an inversion pulse, applying an encode gradient to the phase axis, applying a read gradient to the read axis and applying a rewind gradient to the phase axis, with these operations being implemented once or more, and subsequently emitting an inversion pulse, applying a dephaser gradient to the phase axis, receiving the NMR signal thereby to sample data while applying a readout gradient to the phase axis, rendering the first-order Fourier transform for the sampled data, and determining the correction value for correcting the phase shift caused by the influence of the encode gradient based on the resulting phase data, with the compensation pulse for correcting the 1st-order phase shift based on the determined correction value being put in the encode gradient of the pulse sequence for imaging, or added at one or both of the points immediately preceding and following the encode gradient, or put in the rewind gradient, or added at one or both of the points immediately preceding and following the rewind gradient.

The MRI apparatus of the eighth aspect can carry out properly the phase shift measuring methods of the foregoing first aspect through the third variant aspect. It can also carry out properly the phase shift correction methods of the foregoing fifth aspect through the fifth variant aspect and the foregoing seventh aspect through the tenth variant aspect. Consequently, this apparatus is capable of producing images without artifacts caused by the phase shift.

In a ninth aspect, the present invention resides in an MRI apparatus which comprises an RF pulse emission means, a gradient magnetic field application means, an NMR signal reception means, and a phase shift correction value determining means which operates in the steps of emitting an excitation pulse, emitting an inversion pulse, applying an encode gradient to the phase axis, applying a read gradient to the read axis and applying a rewind gradient to the phase axis, with these operations being implemented once or more, and subsequently emitting an inversion pulse, sampling data from an echo while applying a read gradient to the read axis, but without applying a gradient to the phase axis, and determining the correction value for correcting the 0th-order phase shift caused by the influence of the encode gradient based on phase data resulting from the first-order Fourier transform for the sampled data, with the offset phase for correcting the 0th-order phase shift based on the determined correction value being provided for the inversion pulse, or provided for the echo detection phase, or provided for both.

The MRI apparatus of the ninth aspect can carry out properly the phase shift measuring methods of the foregoing third aspect or fourth aspect. It can also carry out properly the phase shift correction methods of the foregoing sixth aspect through the seventh variant aspect. Consequently, this apparatus is capable of producing images without artifacts caused by the phase shift.

In a tenth aspect, the present invention resides in an MRI apparatus which comprises an RF pulse emission means, a gradient magnetic field application means, an NMR signal reception means, and a phase shift correction value determining means which operates in the steps of emitting an excitation pulse, emitting a first inversion pulse, sampling data from the first echo while applying a read gradient to the read axis, but without applying a gradient to the phase axis, evaluating a first 0th-order term $\phi 0$ based on phase data resulting from the first-order Fourier transform for the sampled data, emitting an excitation pulse, emitting a first inversion pulse, applying an encode gradient to the phase axis, applying a read gradient to the read axis and applying a rewind gradient to the phase axis, and subsequently emitting a second inversion pulse, sampling data from the second echo while applying a read gradient to the read axis, but without applying a gradient to the phase axis, evaluating a second 0th-order term $\phi 1$ based on phase data resulting from the first-order Fourier transform for the sampled data, and determining the correction value for correcting the 0th-order phase shift caused by the influence of the encode gradient based on the first 0th-order term $\phi 0$ and second 0th-order term φ1, with the offset phase for correcting the 0th-order phase shift based on the determined correction value being provided for the inversion pulse after the second inversion pulse, or provided for the echo detection phase, or provided for both.

As an equivalent of the tenth aspect, the first 0th-order term φ0 may be evaluated based on phase data resulting from the first-order Fourier transform of data sampled from the second echo, instead of the first echo.

The eddy current is also created by the addition of the dephaser gradient and rephaser gradient, and therefore the measurement result can possibly be inconsistent with that of main scanning unless their influence is eliminated. On this account, the MRI apparatus of the tenth aspect eliminates completely the use of the dephaser gradient and rephaser gradient. Accordingly, the apparatus is rid of the influence of the eddy current caused by the dephaser gradient and rephaser gradient, and it can measures the phase shift attributable to the preceding encode gradient. Consequently, the apparatus is capable of producing images without artifacts caused by the phase shift.

The inventive phase shift measuring method is capable of measuring accurately the 1st-order and 0th-order phase shifts caused by the influence of the eddy current and residual magnetization attributable to the encode gradient, etc.

The inventive phase shift correcting method is capable of correcting accurately the 1st-order and 0th-order phase shifts caused by the influence of the eddy current and residual magnetization attributable to the encode gradient, etc., thereby producing images without deterioration.

The inventive MRI apparatus is capable of carrying out properly these phase shift measuring method and phase shift correction method.

Other features and advantages of the invention will become apparent from the following description taken in conjunction with the accompanying drawings.

DESCRIPTION OF THE PREFERRED EMBODIMENTS

Figure 1:
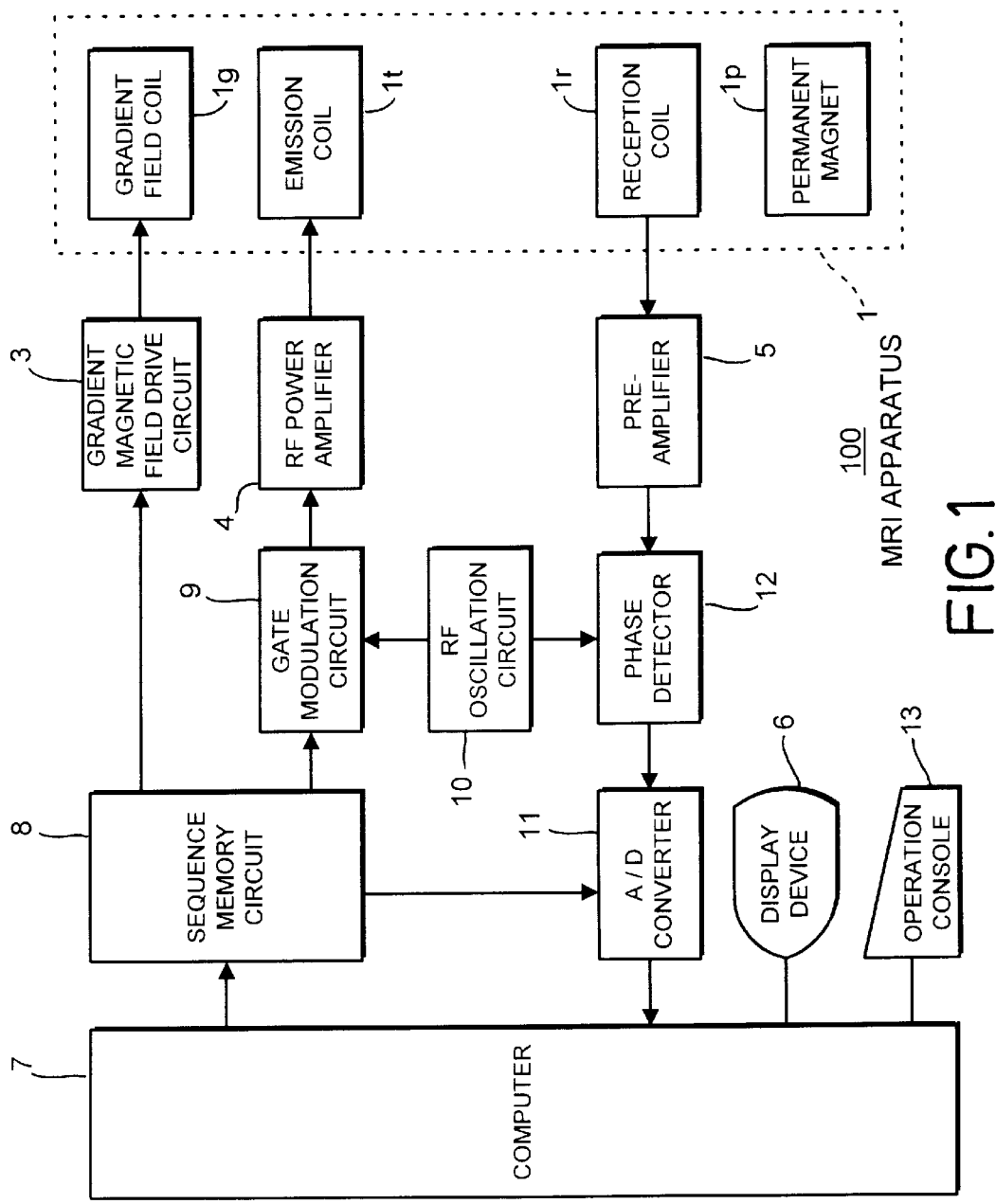
FIG. 1 is a block diagram showing the MRI apparatus based on an embodiment of this invention.

FIG. 1 is a block diagram of the MRI apparatus which is common to the first through ninth embodiments of this invention.

The MRI apparatus 100 includes a magnet assembly 1 having a space (bore) where a subject body is placed. Disposed around the bore are a permanent magnet 1p which applies a constant main magnetic field to the subject body, a gradient field coil 1g which generates gradient magnetic fields along the slice axis, phase axis and read axis, an emission coil 1t which emits RF pulses for inducing the spin of nucleus within the subject body, and a reception coil 1r which receives the NMR signal from the subject body. The gradient field coil 1g, emission coil 1t and reception coil 1r are connected to a gradient magnetic field drive circuit 3, RF power amplifier 4 and pre-amplifier 5, respectively.

A sequence memory circuit 8 operates the gradient magnetic field drive circuit 3 based on a stored pulse sequence in accordance with the command of a computer 7 so that the gradient field coil 1g of the magnet assembly 1 generates gradient magnetic fields, and operates a gate modulation circuit 9 so that the carrier output signal of an RF oscillation circuit 10 is modulated into a pulse signal having a prescribed timing and prescribed envelope. The pulse signal is amplified by the RF power amplifier 4 and thereafter fed to the emission coil 1t of the magnet assembly 1 so that an intended slice region of the subject body is excited selectively.

The pre-amplifier 5 amplifies the NMR signal from the subject body detected by the reception coil 1r of the magnet assembly 1. A phase detector 12, which receives the carrier output signal of the RF oscillation circuit 10 as a reference signal, implements the phase detection for the amplified NMR signal from the pre-amplifier 5. An A/D converter 11 converts the phase-detected analog signal from the pre-amplifier 5 into a digital signal (data).

The computer 7 fetches data from the A/D converter 11 and implements the computation of image rearrangement for the data thereby to produce an image of the intended slice region, and the image is displayed on a display device 6. The computer 7 also serves for the general control of the apparatus including the transaction of information with an operation console 13.

Embodiment 1

The first embodiment is intended to correct the 1st-order and 0th-order phase shifts based on the split echo train method.

In the split echo train method, a dephase component, which is created by the former-part encode gradient gy that is applied for producing the first image, is added to the echo sampling time (period of application of a read gradient gxw) of the latter part, causing a large phase shift to emerge relative to echos echo' of the latter part. This phase shift, with its value having the 1st-order variation on the phase axis of the K-space, will be called "1st-order phase shift".

The gradient magnetic field includes a 0th-order term (B0 component) due to a mismatched layout of the RF shield, coils, etc. Although the 0th-order term of the gradient field is a uniform component independent of the location, it eventually has a time characteristic of exponential fall similar to the eddy current, and it causes a phase shift. This phase shift is called "0th-order phase shift".

Figure 2:
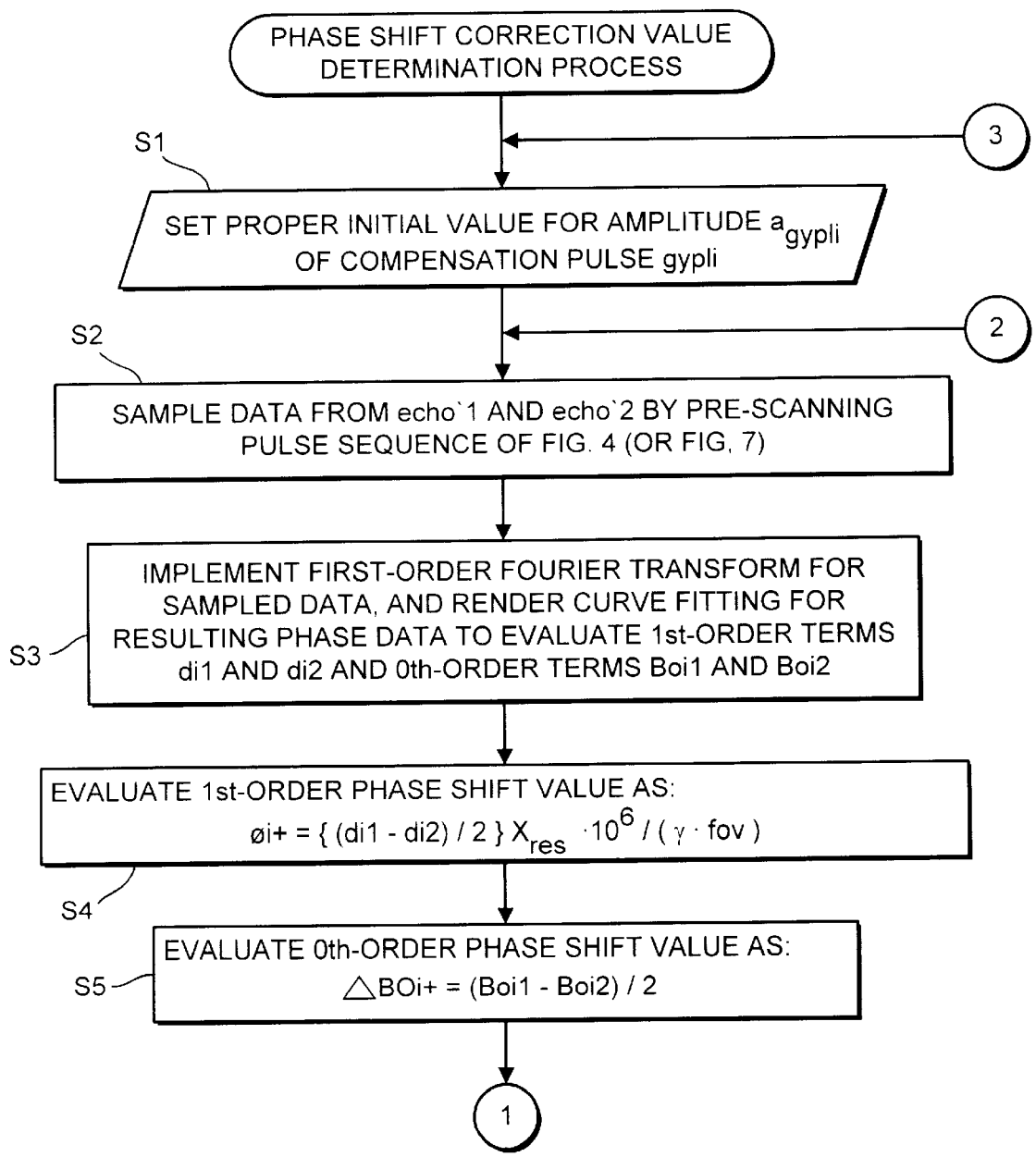
FIG. 2 and FIG. 3 are a series of flowcharts showing the phase shift correction value determination process based on a first embodiment.
Figure 3:
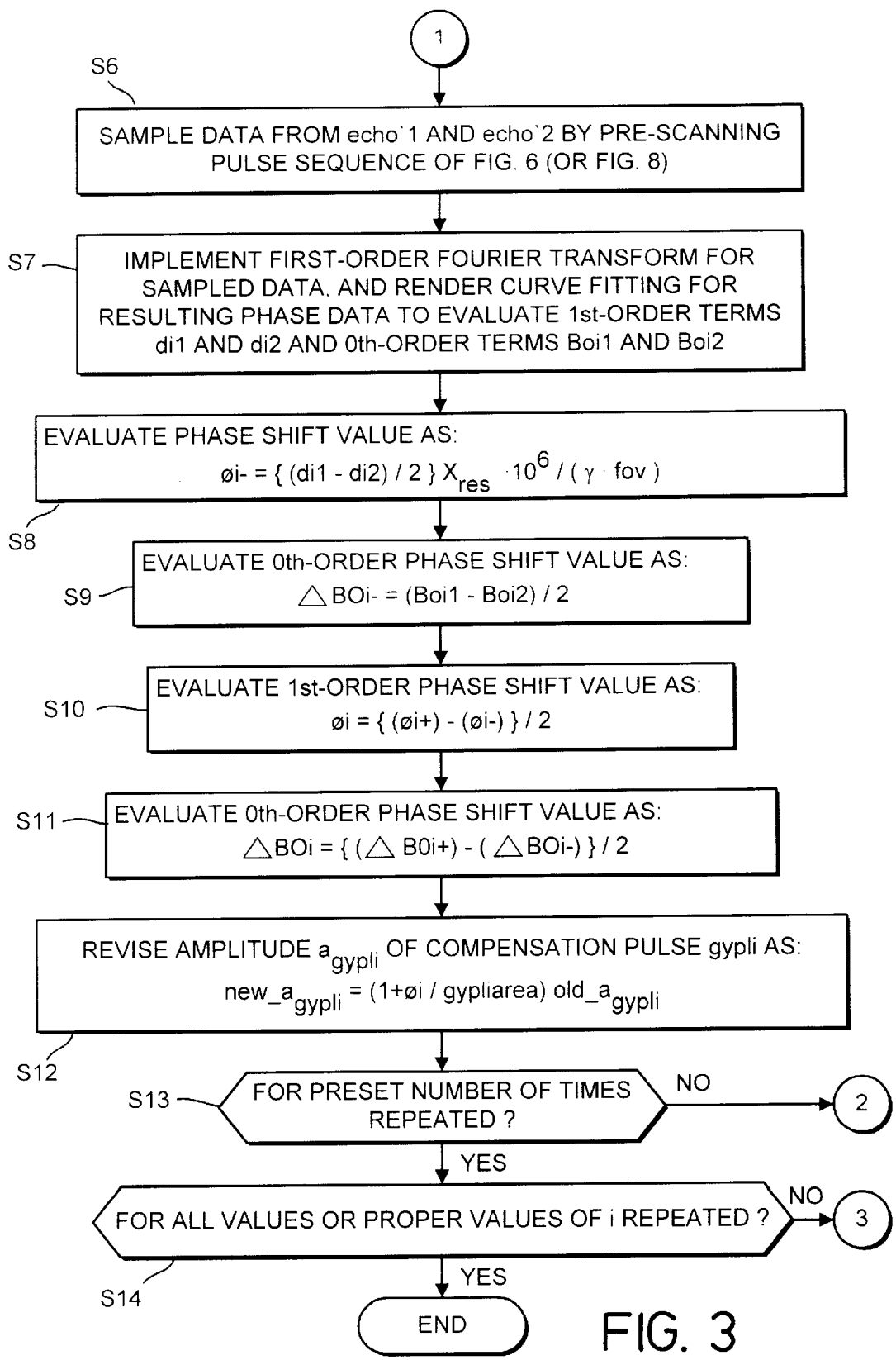

FIG. 2 and FIG. 3 show by flowchart the phase shift correction value determination process which determines the correction value for correcting the 1st-order and 0th-order phase shifts based on the split echo train method.

Step S1 sets a proper initial value for the amplitude $a_{gyp1i}$ of a compensation pulse gyp1i in the pulse sequence of pre-scanning shown in FIG. 4, FIG. 6, FIG. 7 and FIG. 8. The suffixal character "i" denotes the repetition number, and how to choose a value for i will be explained later.

Figure 4:
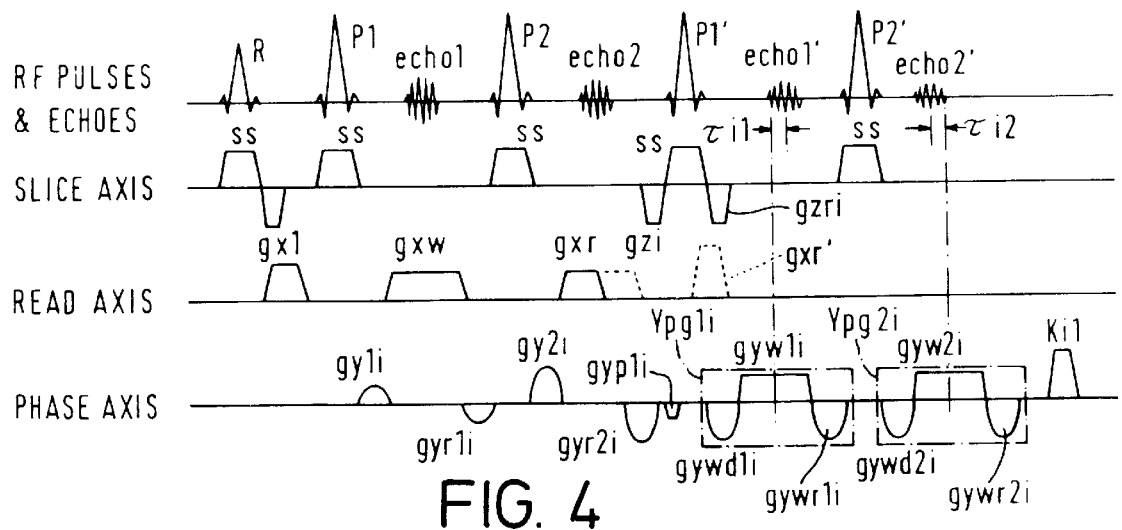
FIG. 4 is a diagram showing an example of the pulse sequence of pre-scanning based on the first embodiment.
Figure 7:
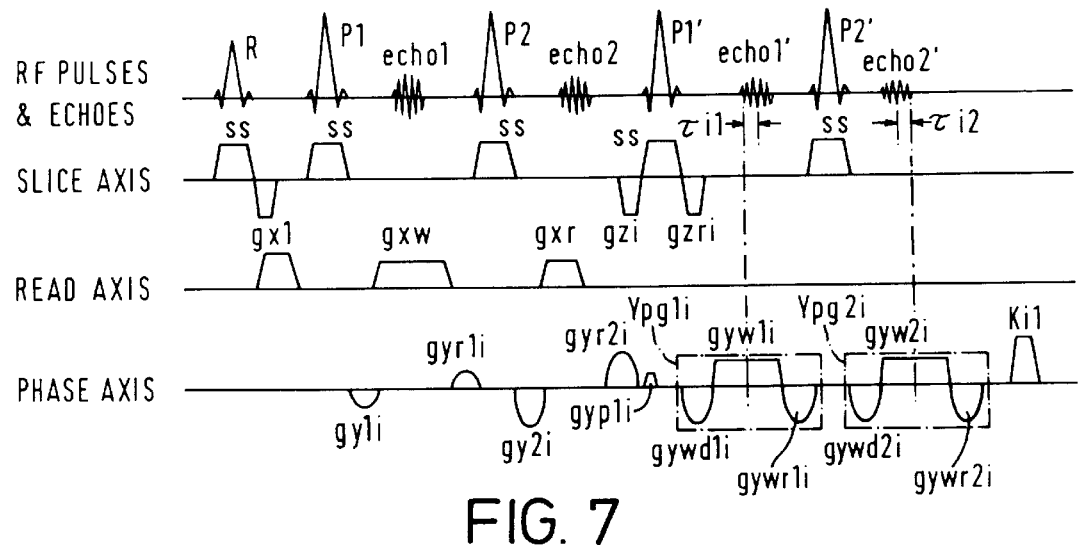
FIG. 7 is a diagram showing another example of the pulse sequence of pre-scanning based on the first embodiment.

Step S2 samples data from latter-part echos echo'1 and echo'2 by the pulse sequence of pre-scanning shown in FIG. 4 in the case of an encode gradient gy with a positive polarity or by the pulse sequence of pre-scanning shown in FIG. 7 in the case of an encode gradient gy with a negative polarity.

In the pulse sequences of pre-scanning shown in FIG. 4 and FIG. 7, an excitation pulse R and a slice gradient ss are applied at the beginning. Next, a first inversion pulse P1 and a slice gradient ss of the former part are applied. Next, an encode gradient gy1i is applied to the phase axis. Next, a read gradient gxw is applied. Thereafter, a rewind gradient gyr1i having an equal time integral value and opposite polarity with respect to the encode gradient gy1i is applied to the phase axis.

Shown in FIG. 4 is the case of the echo train number N equal to 4, and for the number N greater than 4, the operation from the emission of inversion pulse P up to the application of rewind gradient gyr is repeated N/2−1 times.

Subsequently, the last inversion pulse P2 and a slice gradient ss of the former part are applied, and an encode gradient gy2i is applied to the phase axis. Next, a read gradient gxr, which is the former half of the read gradient gxw, is applied thereby to rephase the read gradient. After that, the read gradient is kept "0". Thereafter, a rewind gradient gyr2i having an equal time integral value and opposite polarity with respect to the encode gradient gy2i is applied to the phase axis.

As an equivalent of the above-mentioned pulse sequence, a usual read gradient gxw is applied instead of the read gradient gxr, and thereafter a rewind gradient gxr' that is half in area of the read gradient gxw is applied to the read axis, as shown by the dotted line in FIG. 4.

Next, a compensation pulse gyp1i having an opposite polarity relative to the encode gradient gy is applied to the phase axis.

Subsequently, a first latter-part inversion pulse P'1 and a slice gradient ss, with crusher gradients gzi and gzri for eliminating stimulated echos being appended to the front and end thereof, are applied. Next, a dephaser gradient gywd1i which is identical to the rewind gradient gyr2i is applied. Next, the NMR signal is received from the echo'1 while applying a readout gradient gyw1i to the phase axis, and thereafter a rephaser gradient gywr1i which is identical to the dephaser gradient gywd1i is applied to the phase axis.

Figure 5:
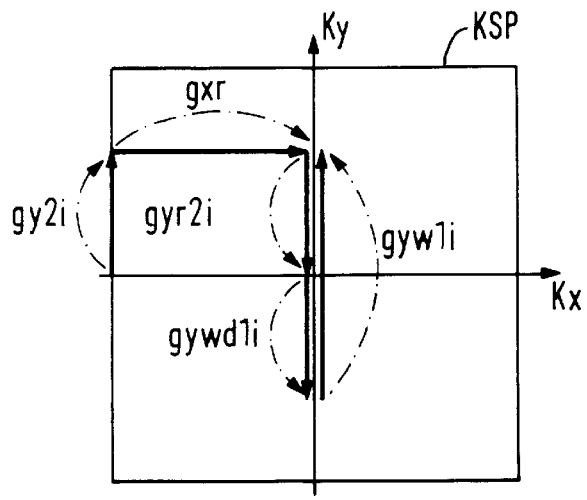
FIG. 5 is a diagram explaining the trajectory in the K-space of the pulse sequence of FIG. 4.

FIG. 5 shows the trajectory in the K-space KSP in the period from the last former-part encode gradient gy2i up to the readout gradient gyw1i of the pulse sequence of FIG. 4. At the sampling of data from the echo'1, only the NMR signal component on the Ky axis is received. In this sense, a bunch of the dephaser gradient gywd1i, readout gradient gyw1i and rephaser gradient gywr1i are called a "phase-axis projection (Y projection) pulse Ypg1i".

Next, a second inversion pulse P'2 and a slice gradient ss of the latter part are applied. Next, the NMR signal is received from the echo'2 while applying a phase-axis projection pulse Ypg2i, which is identical to the Ypg1i, to the phase axis. Finally, a killer gradient Ki1 for spoiling the lateral magnetization is applied.

Indicated by $\tau_{i1}$ and $\tau_{i2}$ in FIG. 4 and FIG. 7 signify time shifts between the center of readout gradient gyw and the center of echo', and these time shifts $\tau_{i1}$ and $\tau_{i2}$ represent the influence of the eddy current and residual magnetization attributable to the encode gradients gy1i and gy2i. The time shifts $\tau_{i1}$ and $\tau_{i2}$ can be evaluated accurately as the 1st-order term of the phase of the result of first-order Fourier transform for the sampled data, and accordingly the influence of the eddy current and residual magnetization attributable to the encode gradients gy1i and gy2i can be known accurately.

Returning to FIG. 3, step S3 implements the first-order Fourier transform for the data sampled from the echo'1 and echo'2, and renders the curve fitting for the resulting phase data based on the method of least squares or the like, thereby evaluating the 1st-order terms di1 and di2 and 0th-order terms B0i1 and B0i2.

Step S4 evaluates the 1st-order phase shift value $\phi i+$ by the following formula:

$$\phi i+=\{(di1-di2)/2\}X_{res}\cdot 10^6/(\gamma\cdot fov) \quad (1)$$

where $(di1-di2)/2$ is the manipulation for cancelling the offset phase shift component which emerges even if the encode gradient gy is "0", $X_{res}$ is the number of sampling points of the echo', $\gamma$ is the gyromagnetic ratio, and fov is the size of view field measured in cm.

Step S5 evaluates the 0th-order phase shift value $\Delta B0i+$ by the following formula:

$$\Delta B0i+=(B0i1-B0i2)/2$$

This is the manipulation for cancelling the offset phase shift component which emerges even if the encode gradient gy is "0".

Figure 6:
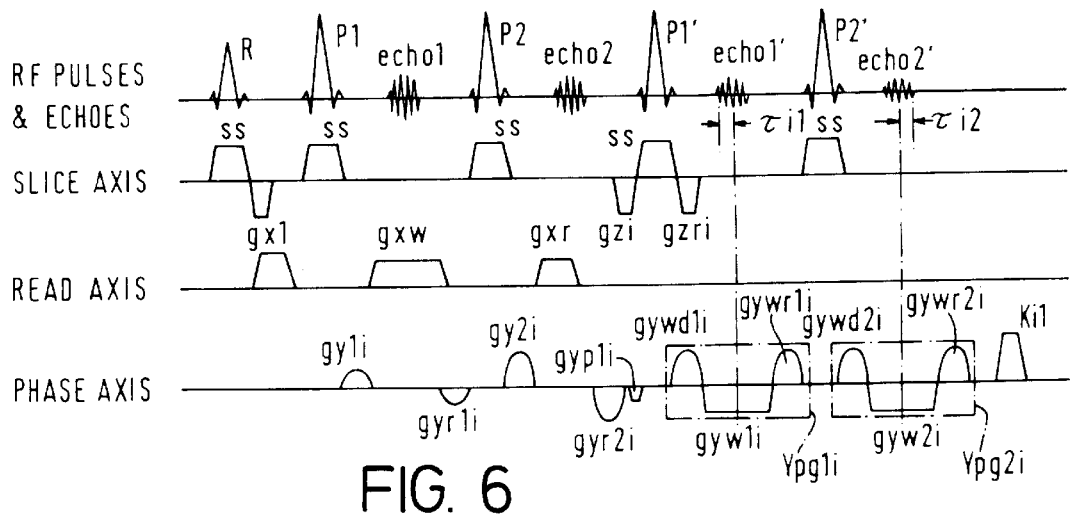
FIG. 6 is a diagram showing an example of the pulse sequence which is derived from the pulse sequence of FIG. 4, with its phase-axis projection pulse being inverted.
Figure 8:
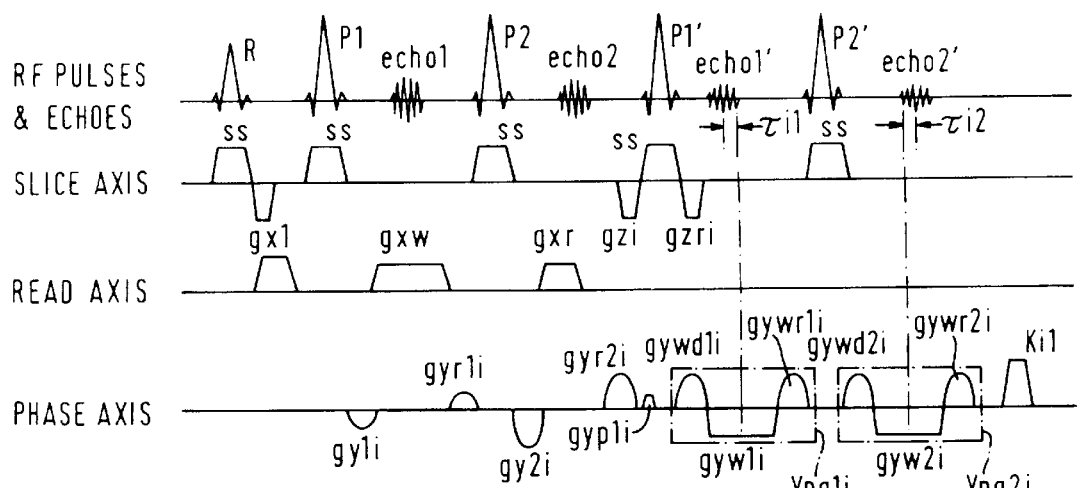
FIG. 8 is a diagram showing an example of the pulse sequence which is derived from the pulse sequence of FIG. 7, with its phase-axis projection pulse being inverted.

Advancing to FIG. 3, step S6 samples data from the latter-part echo'1 and echo'2 by the pulse sequence of pre-scanning shown in FIG. 6 in the case of the encode gradient gy with a positive polarity or by the pulse sequence of pre-scanning shown in FIG. 8 in the case of the encode gradient gy with a negative polarity.

The pulse sequences of pre-scanning shown in FIG. 6 and FIG. 8 are derived from the ones shown in FIG. 4 and FIG. 7, with their phase-axis projection pulses Ypg having their polarity inverted.

Returning to FIG. 3, step S7 implements the first-order Fourier transform for the data sampled from the echo'1 and echo'2, and renders the curve fitting for the resulting phase data based on the method of least squares or the like, thereby evaluating the 1st-order terms di1 and di2 and 0th-order terms B0i1 and B0i2.

Step S8 evaluates the 1st-order phase shift value $\phi i-$ by the following formula:

$$\phi i-=\{(di1-di2)/2\}X_{res}\cdot 10^6/(\gamma\cdot fov)$$

where $(di1-di2)/2$ is the manipulation for cancelling the offset phase shift component which emerges even if the encode gradient gy is "0", $X_{res}$ is the number of sampling points of the echo', $\gamma$ is the gyromagnetic ratio, and fov is the size of view field.

Step S9 evaluates the 0th-order phase shift value $\Delta B0i-$ by the following formula:

$$\Delta B0i-=(B0i1-B0i2)/2$$

This is the manipulation for cancelling the offset phase shift component which emerges even if the encode gradient gy is "0".

Step S10 evaluates the 1st-order phase shift value $\phi i$ by the following formula:

$$\phi i=\{(\phi i+)-(\phi i-)\}/2$$

This is the manipulation for cancelling the influence of the eddy currents created by the phase-axis projection pulses Ypg. The eddy currents caused by two phase-axis projection pulses Ypg of opposite polarities act in opposite directions in regard to the 1st-order phase shift value, and accordingly their influence can be eliminated by dividing by 2 the difference of the 1st-order phase shift values $\phi i+$ and $\phi i-$.

Step S11 evaluates the 0th-order phase shift value $\Delta B0i$ by the following formula:

$$\Delta B0i=\{(\Delta B0i+)-(\Delta B0i-)\}/2$$

This is the manipulation for eliminating the influence of the eddy currents created by the phase-axis projection pulses Ypg.

Step S12 revises the amplitude $a_{gyp1i}$ of the compensation pulse gyp1i by the following formula:

$$\text{new}\_a_{gyp1i}=(1+\phi i/gyp1iarea)\text{old}\_a_{gyp1i} \quad (2)$$

where new$\_a_{gyp1i}$ is the revised amplitude, old$\_a_{gyp1i}$ is the god immediate amplitude, and gyp1iarea is the area of the immediate compensation pulse gyp1i (comparable to the dephase value).

Step S13 repeats the above steps S2 through S12 a preset number of times.

Step S14 repeats the above steps S1 through S13 for all values or proper values of repetition number i of the main scanning for imaging, and thereafter terminates the process.

In case the above steps S1 through S13 are repeated for all values of i, a compensation pulse gyp1i which is optimal for a number of encode gradients can be determined in exchange for a longer pre-scanning time.

Otherwise, in case the steps S1 through S13 are repeated for certain values of i in a shorter pre-scanning time, compensation pulses gyp1i for remaining values of i must be calculated by interpolation from the gyp1i of the specific values of i, or must be substituted with the closest ones of the specific values of i.

Proper values of i are chosen by grouping gradient patterns such that those with the former-part encode gradients gy of a same polarity pattern type are joined in one or more groups, i.e., those with the former-part encode gradients gy of different polarity pattern types are joined in separate groups at least, and selecting a value of i relevant to an average encode gradient in each group.

Figure 9:
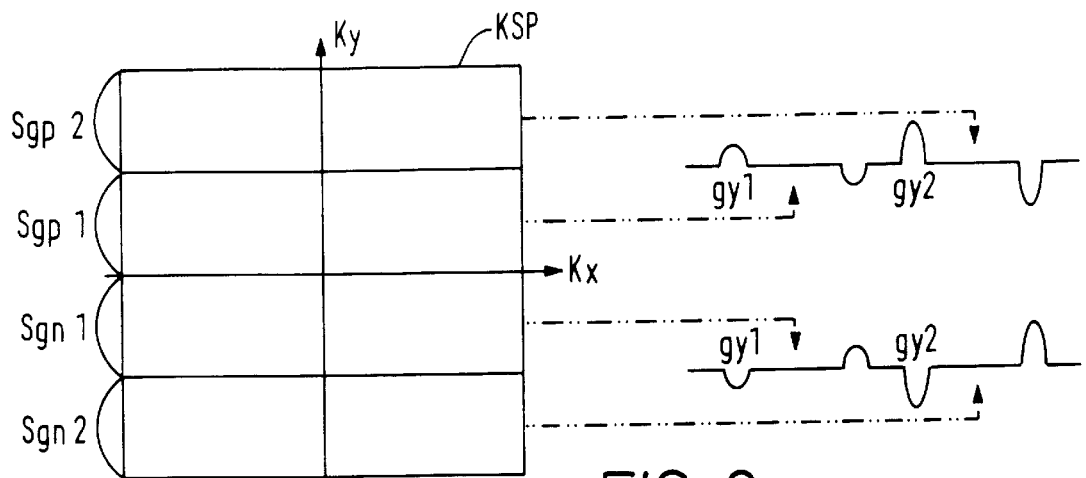
FIG. 9 is a diagram used to explain the relation between segments and echos of central view ordering.
Figure 10:
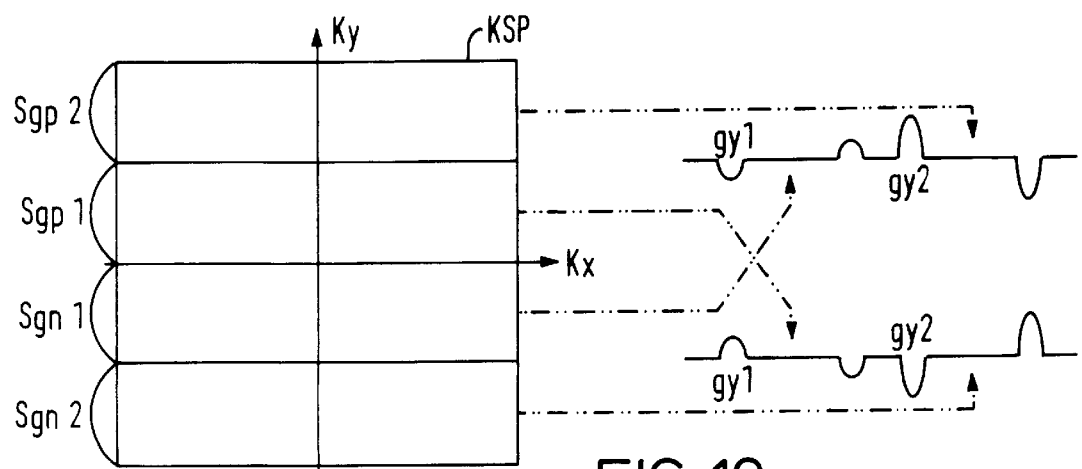
FIG. 10 is a diagram used to explain the relation between segments and echos of sequential view ordering.

FIG. 9 and FIG. 10 explain the manners of segmentation of the K-space KSP. Shown in FIG. 9 is a manner called "centric view ordering", in which data of segment Sgp1 is sampled from the echo1 and echo'1 and data of segment Sgp2 is sampled from the echo2 and echo'2 by providing positive encode gradients gy1 and gy2. Similarly, data of segment Sgn1 is sampled from the echo1 and echo'1 and data of segment Sgn2 is sampled from the echo2 and echo'2 by providing negative encode gradients gy1 and gy2. This manner has two polarity pattern types of encode gradients.

Shown in FIG. 10 is another manner called "sequential view ordering", in which data of segment Sgp1 is sampled from the echo1 and echo'1 and data of segment Sgn2 is sampled from the echo2 and echo'2 by providing a positive encode gradient gy1 and negative encode gradient gy2, respectively. Similarly, data of segment Sgn1 is sampled from the echo1 and echo'1 and data of segment Sgp2 is sampled from the echo2 and echo'2 by providing a negative encode gradient gy1 and positive encode gradient gy2, respectively. This manner also has two polarity pattern types of encode gradients.

In the case of FIG. 9 of centric view ordering with N=4, encode gradients gy of different polarities are grouped separately at least, and correction values for values of i that represent these groups are determined. Preferably, encode gradients of each polarity pattern are divided into two or more groups, and correction values for values of i that represent these groups are determined.

In the case of FIG. 10 of sequential view ordering with N=4, a pattern with a positive encode gradient gy1 and negative encode gradient gy2 and a pattern with a negative encode gradient gy1 and positive encode gradient gy2 are grouped separately at least, and correction values for values of i that represent these groups are determined. Preferably, each pattern is divided into two or more groups, and correction values for values of i that represent these groups are determined.

Figure 11:
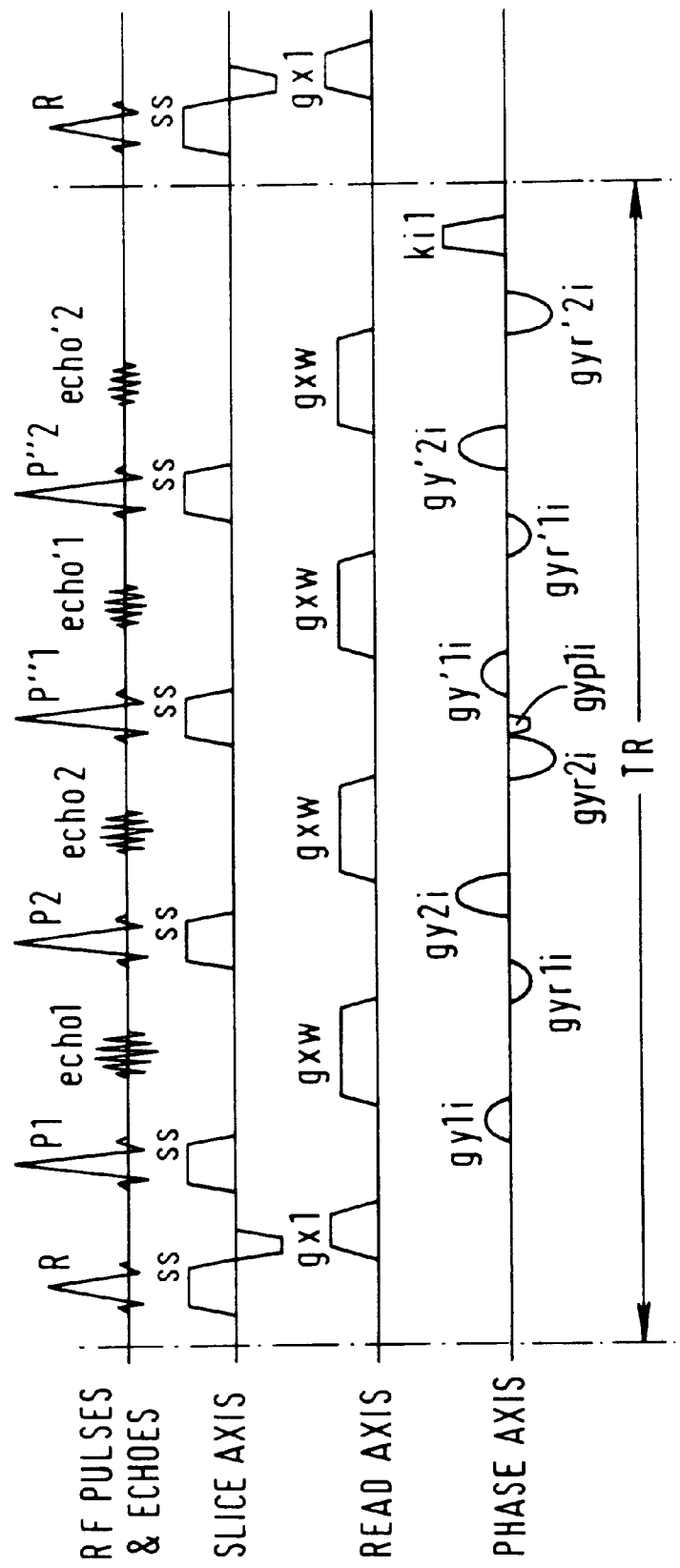
FIG. 11 is a diagram showing an example of the pulse sequence of the split echo train method, with a compensation pulse being added at the end of the last former-part rewind gradient.

FIG. 11 shows a first example of the pulse sequence of main scanning for the formation of the first and second images.

This pulse sequence is designed to correct the 1st-order phase shift by adding the compensation pulse gyp1i determined by the foregoing phase shift correction value determination process to the end of the last former-part rewind gradient gyr2i of the pulse sequence of the split echo train method. Inversion pulses P" with the rendition of an offset phase by the amount comparable to the 0th-order phase shift value $\Delta B0i$ evaluated by the phase shift correction value determination process are emitted thereby to correct the 0th-order phase shift.

Figure 12:
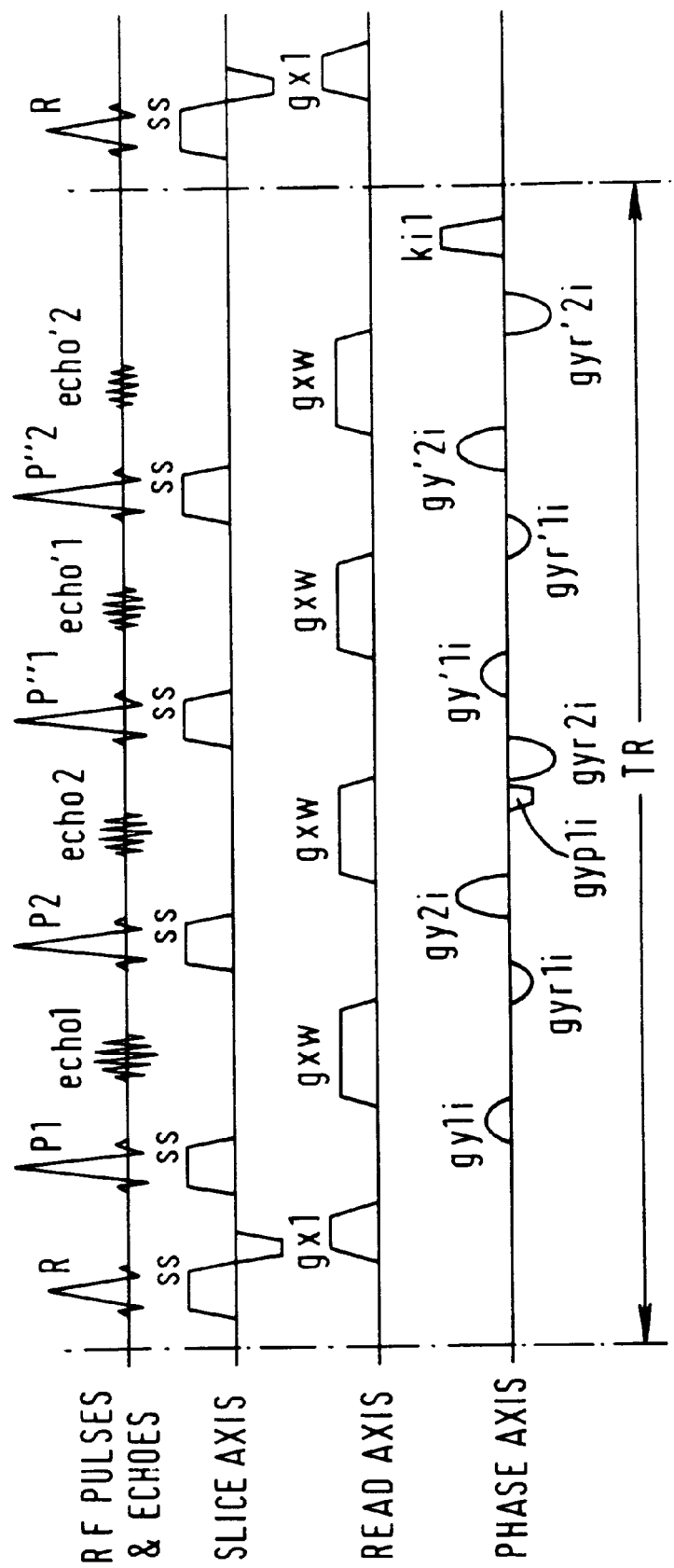
FIG. 12 is a diagram showing an example of the pulse sequence of the split echo train method, with a compensation pulse being added at the front of the last former-part rewind gradient.

FIG. 12 shows a second example of the pulse sequence of main scanning for the formation of the first and second images.

This pulse sequence is designed to correct the 1st-order phase shift by adding the compensation pulse gyp1i determined by the foregoing phase shift correction value determination process to the front of the last former-part rewind gradient gyr2i of the pulse sequence of the split echo train method such that the gyp1i and the read gradient gxw do not overlap. Inversion pulses P" with the rendition of an offset phase by the amount comparable to the 0th-order phase shift value $\Delta B0i$ evaluated by the phase shift correction value determination process are emitted thereby to correct the 0th-order phase shift.

The first and second examples of FIG. 11 and FIG. 12 may be combined to add the compensation pulses gyp1i to the front and end of the rewind gradient gyr2i.

Figure 13:
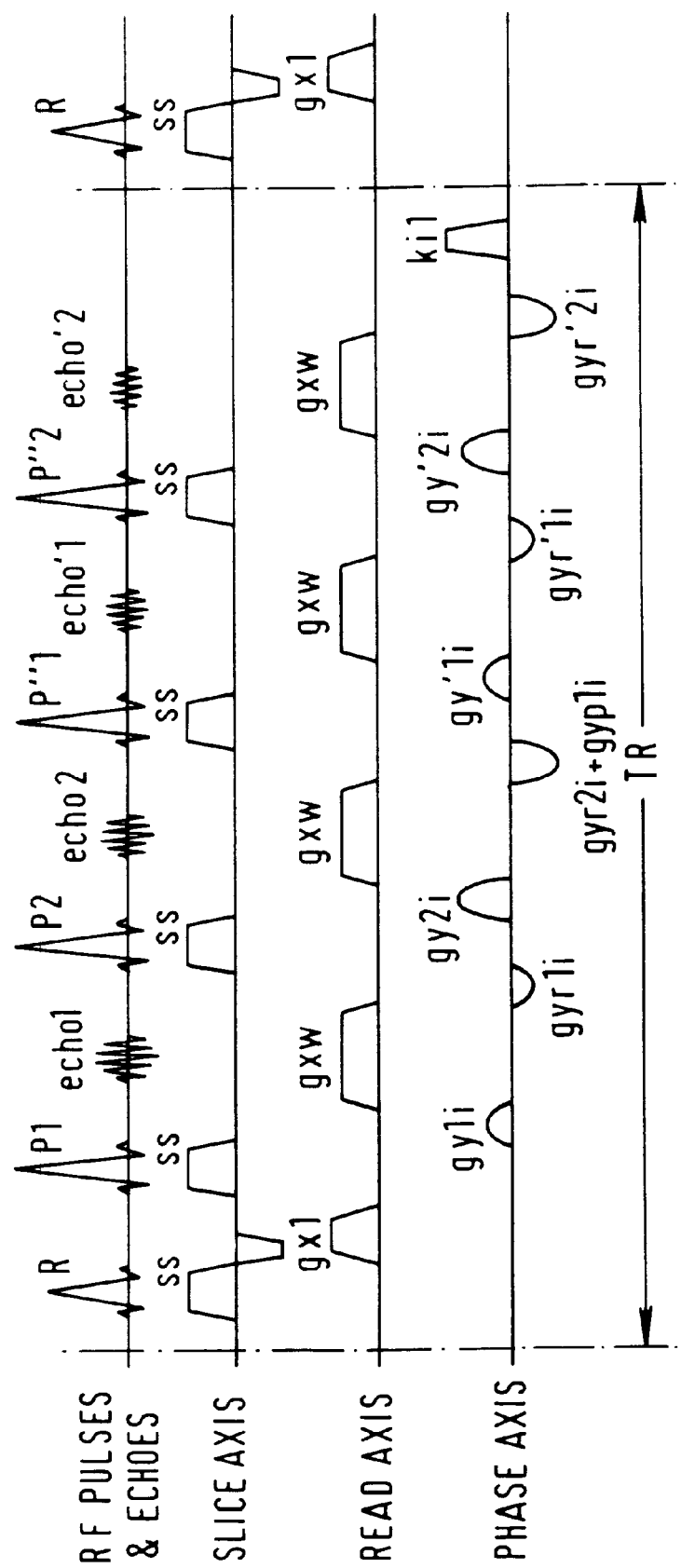
FIG. 13 is a diagram showing an example of the pulse sequence of the split echo train method, with a compensation pulse being put in the last former-part rewind gradient.

FIG. 13 shows a third example of the pulse sequence of main scanning for the formation of the first and second images.

This pulse sequence is designed to correct the 1st-order phase shift by putting the compensation pulse gyp1i determined by the foregoing phase shift correction value determination process in the last former-part rewind gradient gyr2i of the pulse sequence of the split echo train method. Inversion pulses P" with the rendition of an offset phase by the amount comparable to the 0th-order phase shift value $\Delta B0i$ evaluated by the phase shift correction value determination process are emitted thereby to correct the 0th-order phase shift.

Figure 14:
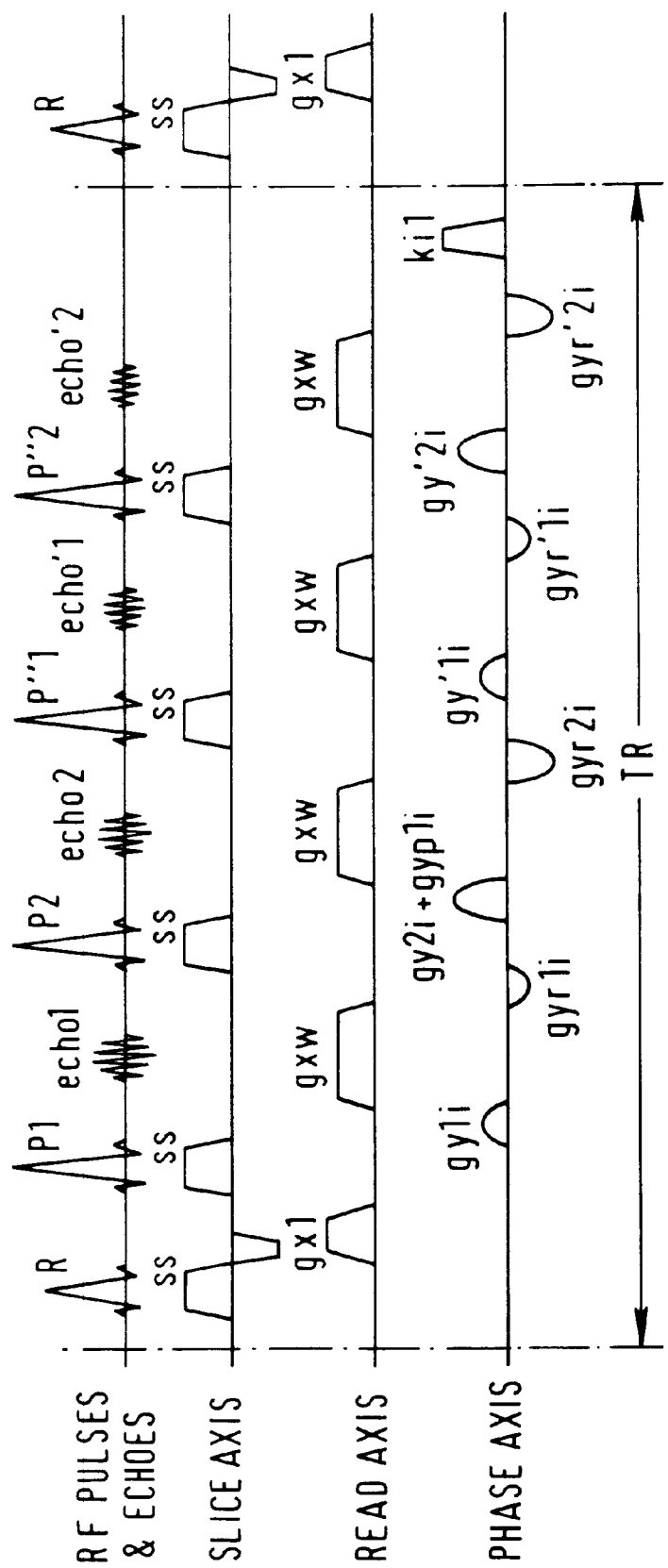
FIG. 14 is a diagram showing an example of the pulse sequence of the split echo train method, with a compensation pulse being put in the last former-part encode gradient.

FIG. 14 shows a fourth example of the pulse sequence of main scanning for the formation of the first and second images.

This pulse sequence is designed to correct the 1st-order phase shift by putting the compensation pulse gyp1i determined by the foregoing phase shift correction value determination process in the last former-part encode gradient gy2i of the pulse sequence of the split echo train method. Inversion pulses P" with the rendition of an offset phase by the amount comparable to the 0th-order phase shift value $\Delta B0i$ evaluated by the phase shift correction value determination process are emitted thereby to correct the 0th-order phase shift.

Alternatively, the 0th-order phase shift may be corrected by rendering an offset phase by the amount comparable to the 0th-order phase shift value $\Delta B0i$ to the detection phase of the phase detector 12, instead of emitting inversion pulses P" with the rendition of an offset phase by the amount comparable to $\Delta B0i$.

Alternatively, the 0th-order phase shift may be corrected by the amount comparable to $\Delta B0i$ by rendering the offset phase to the detection phase of the phase detector 12, in addition to the emission of inversion pulses with the rendition of the offset phase.

Figure 15:
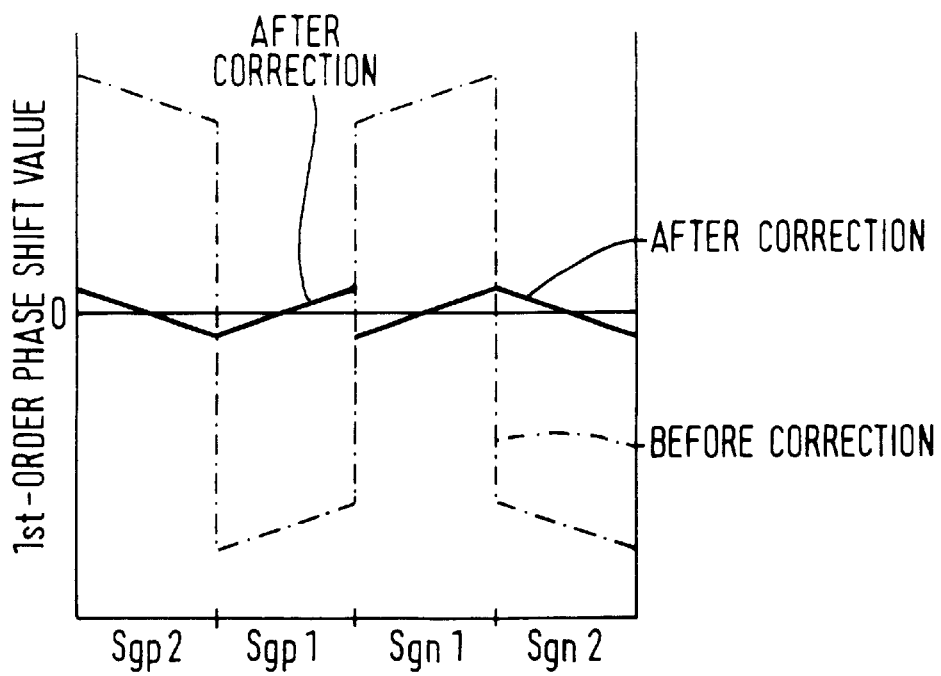
FIG. 15 is a diagram explaining the effect of correction by the compensation pulse.

FIG. 15 explains the effect of the 1st-order phase shift correction. Compensation pulses are determined by choosing values of i that correspond to the centers of the segments Sgp1, Sgp2, Sgn1 and Sgn2 shown in FIG. 9, and consequently the 1st-order phase shift is "0" at the center of each segment and it remains at other points.

Figure 16:
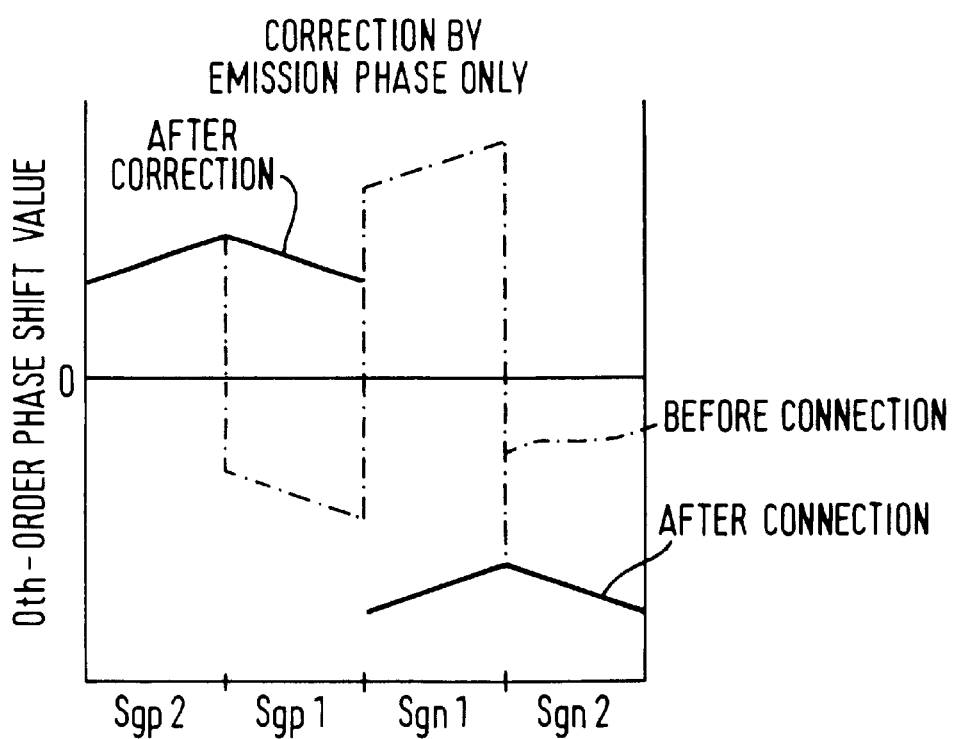
FIG. 16 is a diagram explaining the effect of correction by rendering an offset phase to the inversion pulse.
Figure 17:
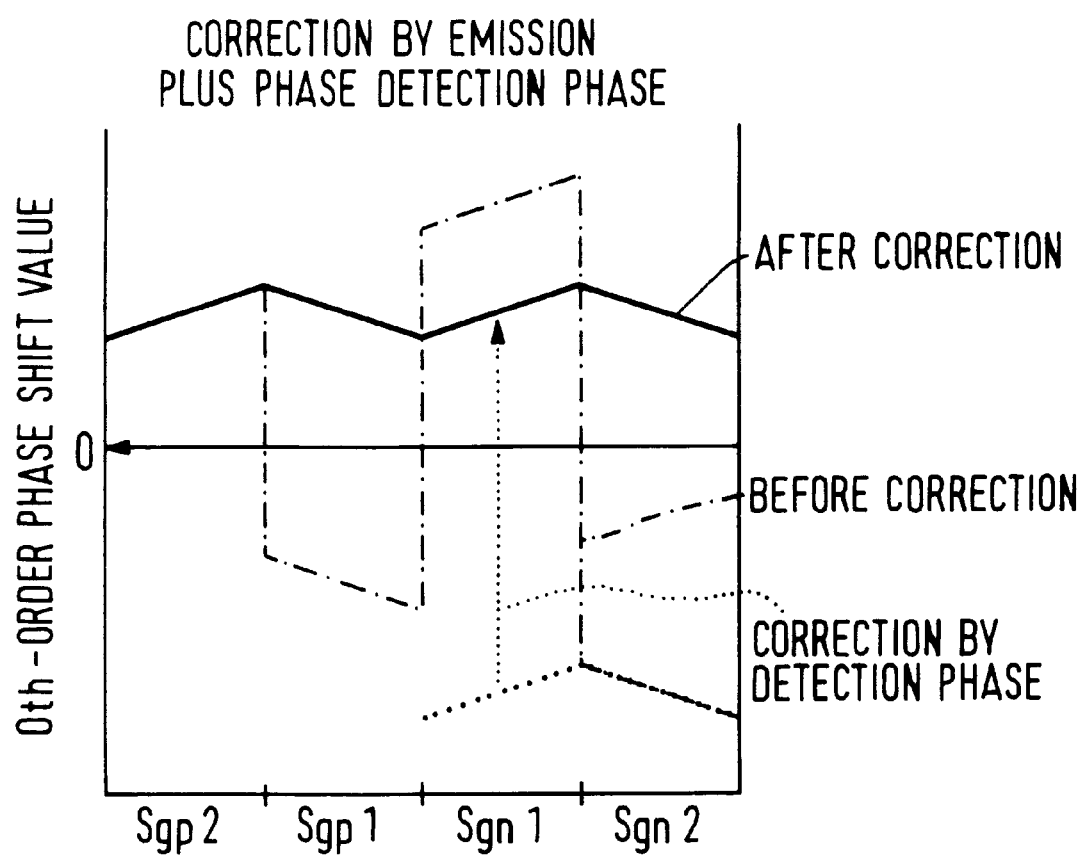
FIG. 17 is a diagram explaining the effect of correction by rendering an offset phase to the inversion pulse and to the detection phase.

FIG. 16 and FIG. 17 explain the effect of the 0th-order phase shift correction. FIG. 16 is the case of correction by solely emitting inversion pulses with the rendition of an offset phase, and FIG. 17 is the case of correction by the rendition of an offset phase to the detection phase of the phase detector 12 in addition to the emission of inversion pulse with the rendition of the offset phase. The 0th-order phase shift is allowed of being non-zero, provided that it differs little among views.

In this manner, it is possible to prevent the deterioration of the second image caused by the inference of the eddy current and residual magnetization attributable to the former-part encode gradient gy.

Embodiment 2

In contrast to the first embodiment which uses two phase-axis projection pulses Ypg1i and Ypg2i and evaluates the difference of the obtained phase shift values, a single phase-axis projection pulse Ypg1i may be used for cancelling the offset phase shift component which emerges even if the encode gradient gy is "0". In this case of the second embodiment, the offset phase shift component is cancelled at the process of difference evaluation of phase shift values obtained from the phase-axis projection pulse Ypg1i of both polarities.

It is also possible to cancel the offset phase shift component by measuring the 1st-order term di0, with the encode gradient gy being set to "0", and subtracting it from the phase shift value.

Embodiment 3

The third embodiment is intended to determine the 0th-order phase shift correction value without using the phase-axis projection pulse Ypg.

The phase-axis projection pulse Ypg (particularly the dephaser gradient gywd and rephaser gradient gywr) of the pulse sequence of pre-scanning shown in FIG. 4 and FIGS. 6, 7 and 8 can cause by itself the 0th-order phase shift. On this account, it is desirable not to use the phase-axis projection pulse Ypg at the determination of the 0th-order phase shift correction value.

Figure 18:
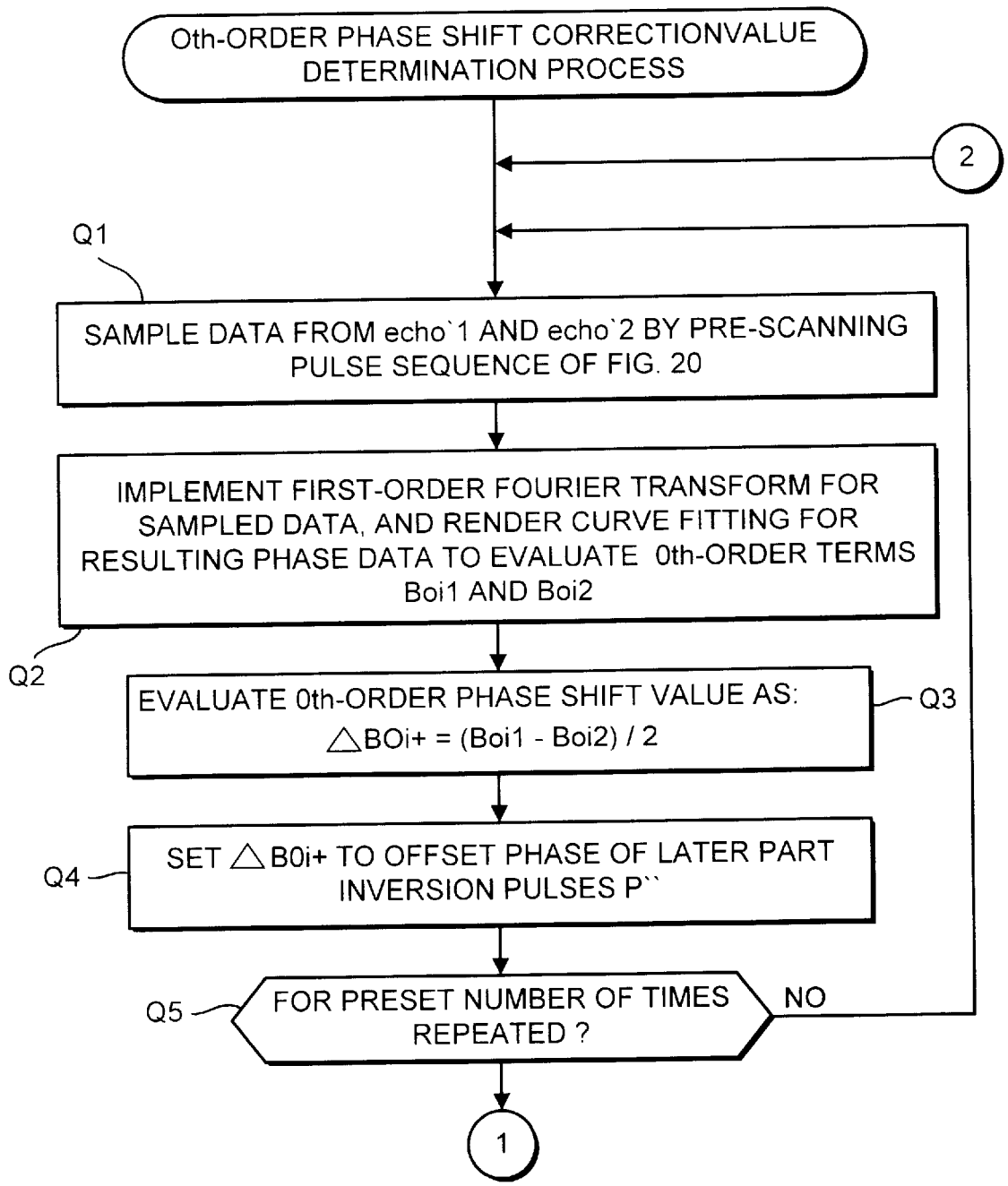
FIG. 18 and FIG. 19 are a series of flowcharts showing the 0th-order phase shift correction value determination process based on a third embodiment.
Figure 19:
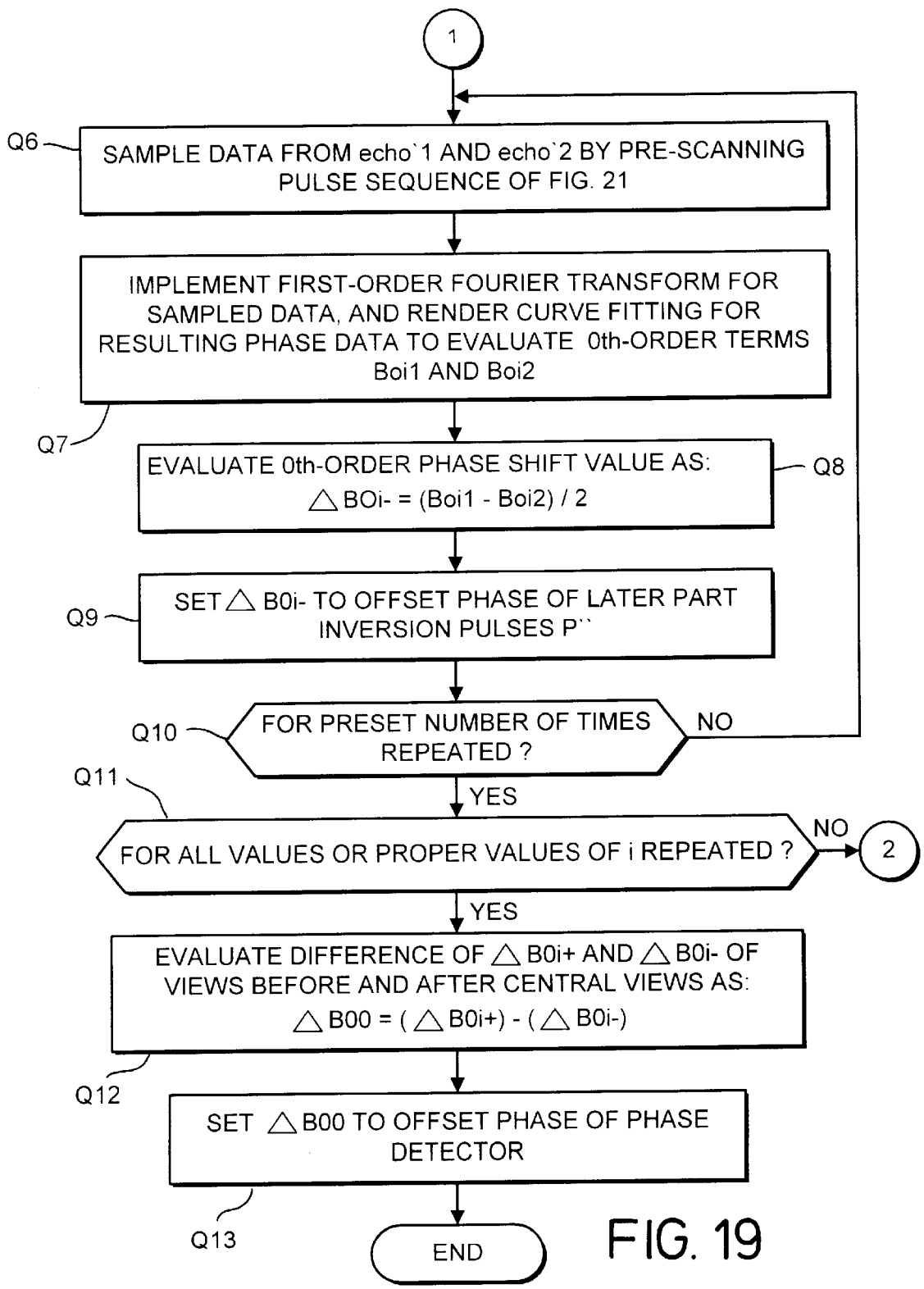

FIG. 18 and FIG. 19 show by flowchart the 0th-order phase shift correction value determination process.

Figure 20:
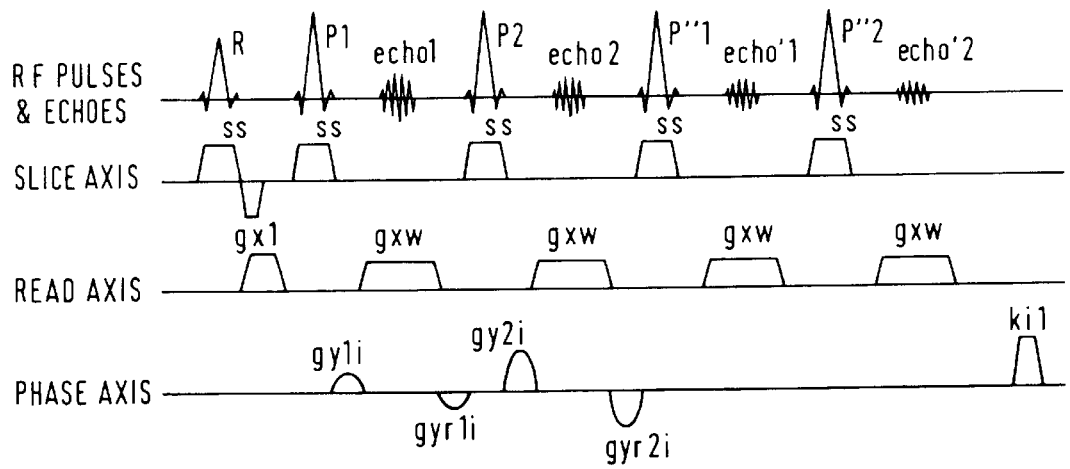
FIG. 20 is a diagram showing an example of the pulse sequence of pre-scanning based on the third embodiment.

Step Q1 samples data from the latter-part echo'1 and echo'2 based on the pulse sequence of pre-scanning shown in FIG. 20. The pulse sequence of pre-scanning shown in FIG. 20 is derived from that of the conventional split echo train method, with its latter-part encode gradients gy' being nullified in correspondence to positive former-part encode gradients gy and inversion pulses P″ with the rendition of an offset phase being emitted.

Step Q2 implements the first-order Fourier transform for the data sampled from the echo′1 and echo′2, and renders the curve fitting for the resulting phase data based on the method of least squares or the like, thereby evaluating the 0th-order terms B0i1 and B0i2.

Step Q3 evaluates the 0th-order phase shift value ΔB0i+ by the following formula:

$$\Delta B0i+=(B0i1-B0i2)/2$$

This is the manipulation for cancelling the offset phase shift component which emerges even if the encode gradient gy is "0".

Step Q4 sets the ΔB0i+ to the offset phase of the latter-part inversion pulses P″.

Step Q5 repeats the above steps Q1 through Q4 a preset number of times.

Figure 21:
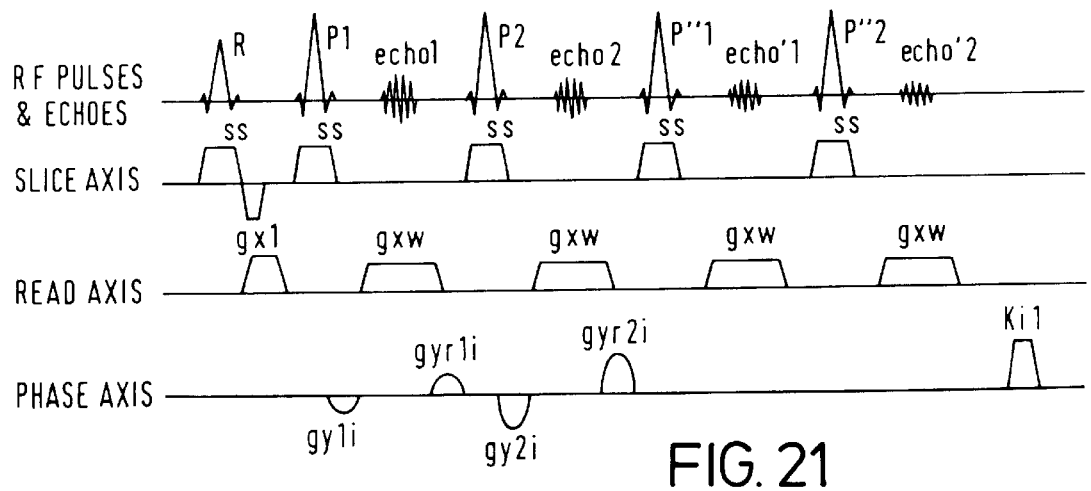
FIG. 21 is a diagram showing another example of the pulse sequence of pre-scanning based on the third embodiment.

Step Q6 in FIG. 19 samples data from the latter-part echo′1 and echo′2 based on the pulse sequence of pre-scanning shown in FIG. 21.

The pulse sequence of pre-scanning shown in FIG. 21 is derived from that of the conventional split echo train method, with its latter-part encode gradients gy′ being nullified in correspondence to negative former-part encode gradients gy and inversion pulses P″ with the rendition of an offset phase being emitted.

Step Q7 implements the first-order Fourier transform for the data sampled from the echo′1 and echo′2, and renders the curve fitting for the resulting phase data based on the method of least squares or the like, thereby evaluating the 0th-order terms B0i1 and B0i2.

Step Q8 evaluates the 0th-order phase shift value ΔB0i− by the following formula:

$$\Delta B0i-=(B0i1-B0i2)/2$$

This is the manipulation for cancelling the offset phase shift component which emerges even if the encode gradient gy is "0".

Step Q9 sets the ΔB0i− to the offset phase of the latter-part inversion pulses P″.

Step Q10 repeats the above steps Q6 through Q9 a preset number of times.

Step Q11 repeats the above steps Q1 through Q10 for all values or proper values of i.

Step Q12 evaluates the difference ΔB00 of the 0th-order phase shift values ΔB0i+ and ΔB0i− of the views before and after the central view, as follows.

$$\Delta B00=(\Delta B0i+)-(\Delta B0i-)$$

Step Q13 renders the offset phase ΔB00 to the detection phase of the phase detector 12, and thereafter terminates the process.

By implementing the correction based on the 0th-order phase shift correction value determined in this manner, it is possible to prevent the deterioration of the second image caused by the 0th-order phase shift.

Embodiment 4

The fourth embodiment is intended to correct the 1st-order and 0th-order phase shifts of the high-speed SE method. In the high-speed SE method, the dephase component created by the encode gradient gy that has been applied for the previously imaged echo is added to the echo to be observed next, resulting in the emergence of a phase shift on it. This phase shift is a 1st-order function of the location, and it is called "1st-order phase shift".

The gradient magnetic field includes a 0th-order term (B0 component) due to a mismatched layout of the RF shield, coils, etc. Although the 0th-order term of the gradient field is a uniform component independent of the location, it eventually has a time characteristic of exponential fall similar to the eddy current, and it causes a phase shift. This phase shift is called "0th-order phase shift".

Figure 22:
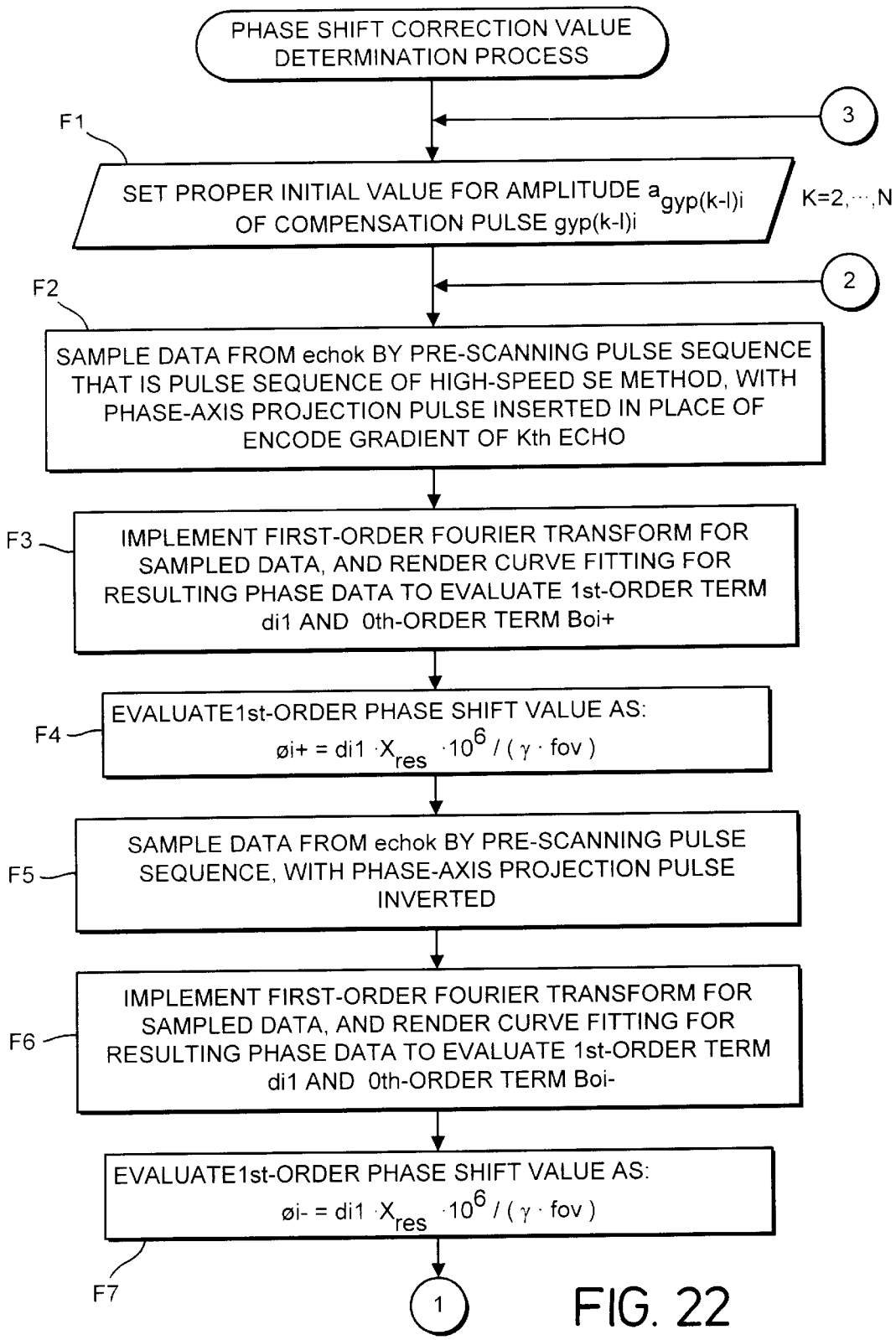
FIG. 22 and FIG. 23 are a series of flowcharts showing the phase shift correction value determination process based on a fourth embodiment.
Figure 23:
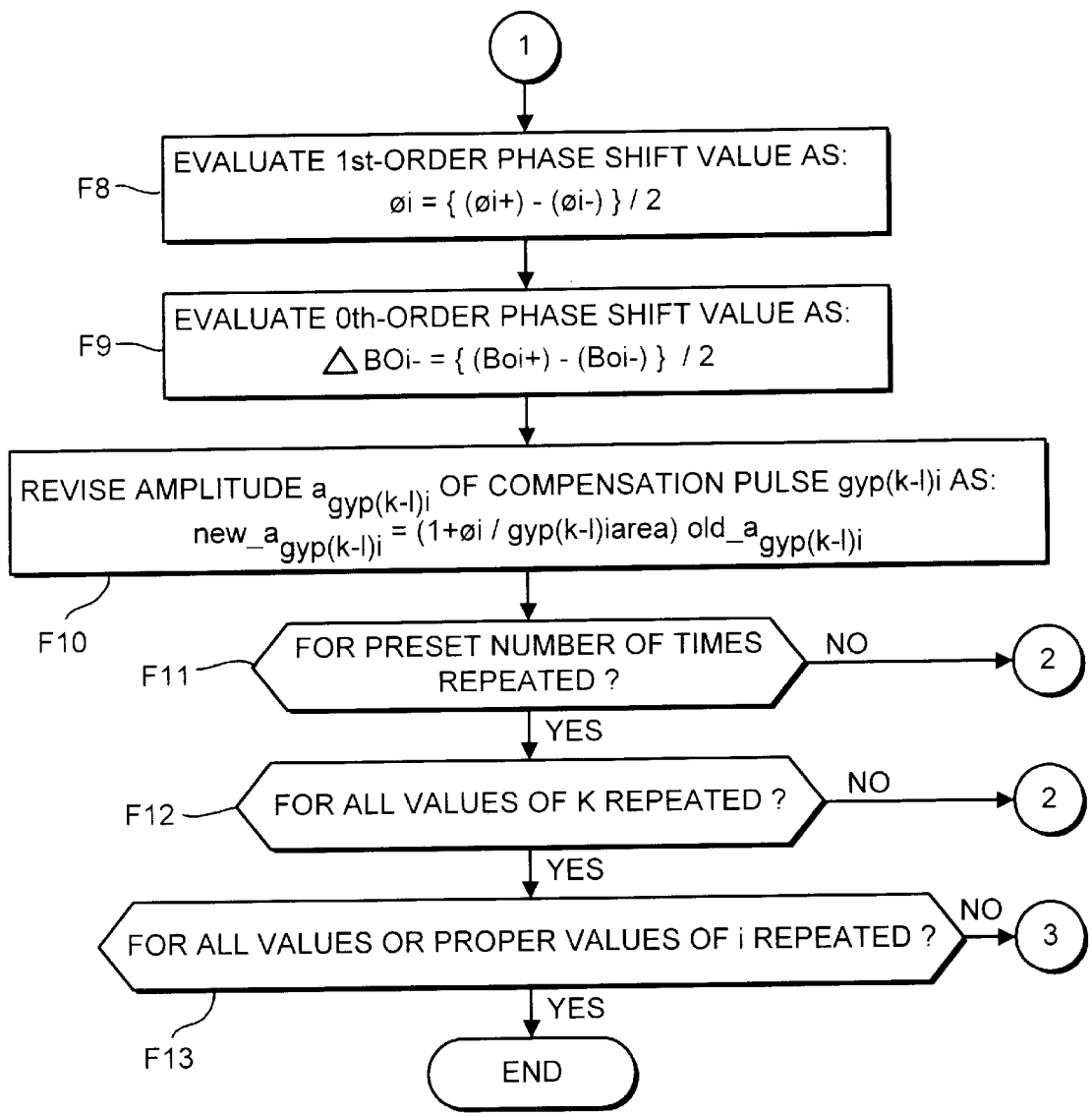

FIG. 22 and FIG. 23 show by flowchart the phase shift correction value determination process for determining the correction values to be added for the correction of the 1st-order and 0th-order phase shifts of the high-speed SE method.

Step F1 sets a proper initial value for the amplitude $a_{gyp(K-1)i}$ of a compensation pulse gyp(K−1)i in the pulse sequence of pre-scanning shown in FIG. 24 through FIG. 27. In this case, K is the serial number of echos for which the phase shift is corrected, and it ranges from 2 to N (number of echo trains). Suffix "i" is the repetition number, and how to choose a value for i will be explained later.

Step F2 samples data from the echoK based on the pulse sequence of pre-scanning that is the pulse sequence of high-speed SE method, with a phase-axis projection pulse YgpKi being inserted in place of the encode gradient gyKi and rewind gradient gyrKi of the Kth echo.

Figure 24:
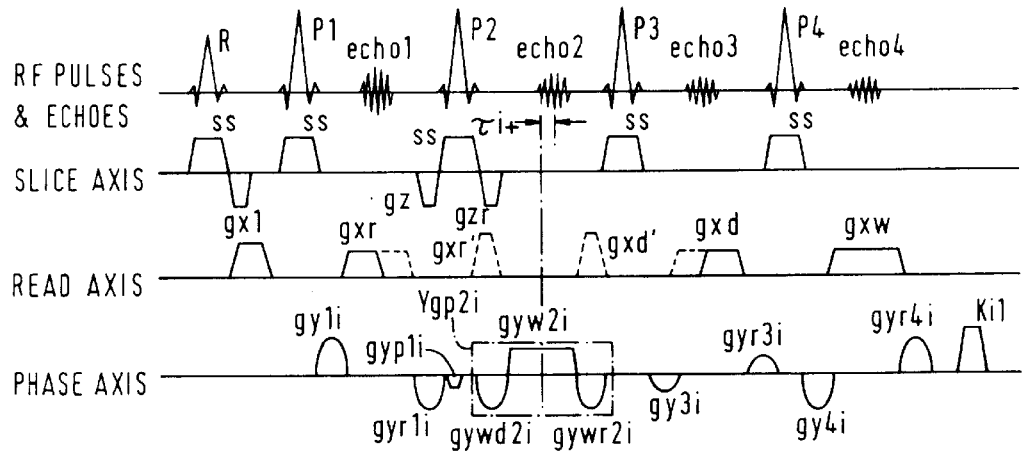
FIG. 24 is a diagram showing an example of the pulse sequence of pre-scanning based on the fourth embodiment.

FIG. 24 shows an example of the pulse sequence of pre-scanning for K=2 and N=4. In this pulse sequence of pre-scanning, an excitation pulse R and a slice gradient ss are applied at the beginning. Next, a first inversion pulse P1 and slice gradient ss are applied. Next, an encode gradient gy1i is applied to the phase axis. Next, a read gradient gxw, which is the former half of the usual read gradient gxw, is applied, and the read gradient is rephased. After that, the read gradient is kept "0" from echo3 until the reception of NMR signal. Next, a rewind gradient gyr1i having an equal time integral value and opposite polarity with respect to the encode gradient gy1i is applied to the phase axis.

As an equivalent of the above-mentioned pulse sequence, a usual read gradient gxw is applied instead of the read gradient gxr, and thereafter a rewind gradient gxr′ that is half in area of the read gradient gxw is applied to the read axis, as shown by the dotted line in FIG. 24.

Next, a compensation pulse gyp1i having an opposite polarity relative to the encode gradient gy1i is applied to the phase axis.

Next, a second inversion pulse P2 and a slice gradient ss, with crusher gradients gzi and gzri for eliminating stimulated echos being appended to the front and end thereof, are applied.

Next, a dephaser gradient gywd2i which is identical to the rewind gradient gyr1i is applied.

Next, the NMR signal is received from the echo2 while applying a readout gradient gyw2i to the phase axis, and thereafter a rephaser gradient gywr2i which is identical to the dephaser gradient gywd2i is applied to the phase axis. A bunch of the dephaser gradient gywd2i, readout gradient gyw2i and rephaser gradient gywr2i are called "phase-axis projection pulse Ypg2i".

Next, for the imaging of the next echo4, a third inversion pulse P3 and a slice gradient ss are applied, an encode gradient gy3i is applied to the phase axis, and a read gradient gxd, which is the latter half of the usual read gradient gxw, is applied.

As an equivalent of the above-mentioned pulse sequence, a read-axis dephaser gradient gxd′ that is half in area of the read gradient gxw is applied and next a usual read gradient gxw is applied to the read axis, as shown by the dotted line in FIG. 24.

After that, a rewind gradient gyr3i having an equal time integral value and opposite polarity with respect to the encode gradient gy3i is applied to the phase axis.

Subsequently, a fourth inversion pulse P4 and a slice gradient ss are applied, an encode gradient gy4i is applied to the phase axis, a read gradient gxw is applied, and thereafter a rewind gradient gyr4i having an equal time integral value and opposite polarity with respect to the encode gradient gy4i is applied to the phase axis.

Finally, a killer gradient Ki1 for spoiling the lateral magnetization is applied.

Indicated by τi in FIG. 24 signifies time shift between the center of readout gradient gyw2i and the center of echo2. The time shift τi represents the influence of the eddy current and residual magnetization attributable to the encode gradient gy1i. The time shift τi can be evaluated accurately as the 1st-order term of the phase of the result of first-order Fourier transform for the sampled data, and accordingly the influence of the eddy current and residual magnetization attributable to the encode gradient gy1i can be understood accurately.

Returning to FIG. 22, step F3 implements the first-order Fourier transform for the data sampled from the echoK, and renders the curve fitting for the resulting phase data based on the method of least squares or the like, thereby evaluating the 1st-order term di1 and 0th-order term B0i+.

Step F4 evaluates the 1st-order phase shift value φi+ by the following formula:

$$\phi i+=di1 \cdot X_{res} \cdot 10^6/(\gamma \cdot fov)$$

where $X_{res}$ is the number of sampling points of the echoK, γ is the gyromagnetic ratio, and fov is the size of view field measured in cm.

Step F5 samples data from the echoK based on the pulse sequence of pre-scanning which is derived from the one used in the preceding step F2, with the phase-axis projection pulse having its polarity inverted.

Figure 25:
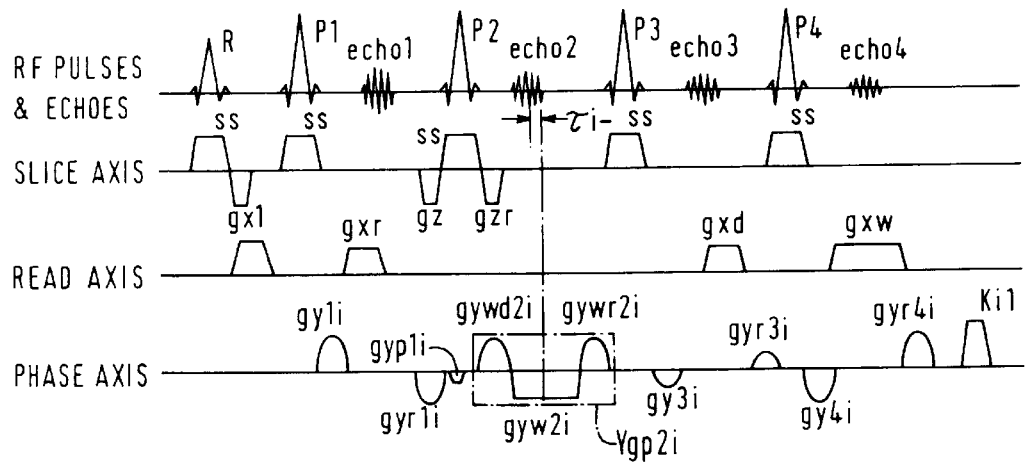
FIG. 25 is a diagram showing an example of the pulse sequence which is derived from the pulse sequence of FIG. 24, with its phase axis projection pulse being inverted.

FIG. 25 shows the pulse sequence which is derived from that of FIG. 24, with the phase-axis projection pulse Ypg2i having its polarity inverted.

Returning to FIG. 22, step F6 implements the first-order Fourier transform for the data sampled from the echoK, and renders the curve fitting for the resulting phase data based on the method of least squares or the like, thereby evaluating the 1st-order term di1 and 0th-order term B0i−.

Step F7 evaluates the 1st-order phase shift value φi− by the following formula:

$$\phi i-=di1 \cdot X_{res} \cdot 10^6/(\gamma \cdot fov)$$

where $X_{res}$ is the number of sampling points of the echoK, γ is the gyromagnetic ratio, and fov is the size of view field.

Advancing to FIG. 23, step F8 evaluates the 1st-order phase shift value φi by the following formula;

$$\phi i=\{(\phi i+)-(\phi i-)\}/2$$

This is the manipulation for cancelling the influence of the eddy currents created by the phase-axis projection pulses Ypg. The eddy currents caused by two phase-axis projection pulses Ypg of opposite polarities act in opposite directions in regard to the 1st-order phase shift value, and accordingly their influence can be eliminated by dividing by 2 the difference of the 1st-order phase shift values φi+ and φi−.

Step F9 evaluates the 0th-order phase shift value ΔB0i by the following formula:

$$\Delta B0i=\{(\Delta B0i+)-(\Delta B0i-)\}/2$$

This is the manipulation for eliminating the influence of the eddy currents created by the phase-axis projection pulses Ypg.

Step F10 revises the amplitude $a_{gyp(K-1)i}$ of the compensation pulse gyp(K−1)i by the following formula:

$$\text{new}\_a_{gyp(K-1)i}=(1+\phi i/gyp(K-1)iarea)\text{old}\_a_{gyp(K-1)i}$$

where new_$a_{gyp(K-1)i}$ is the revised amplitude, old_$a_{gyp(K-1)i}$ is the amplitude before revision, and gyp(K−1)iarea is the area of the compensation pulse gyp(K−1)i (comparable to the dephase value) before revision.

Step F11 repeats the above steps F2 through F10 a preset number of times.

Step F12 repeats the above steps F2 through F11 for all values of K (2 to N).

Figure 26:
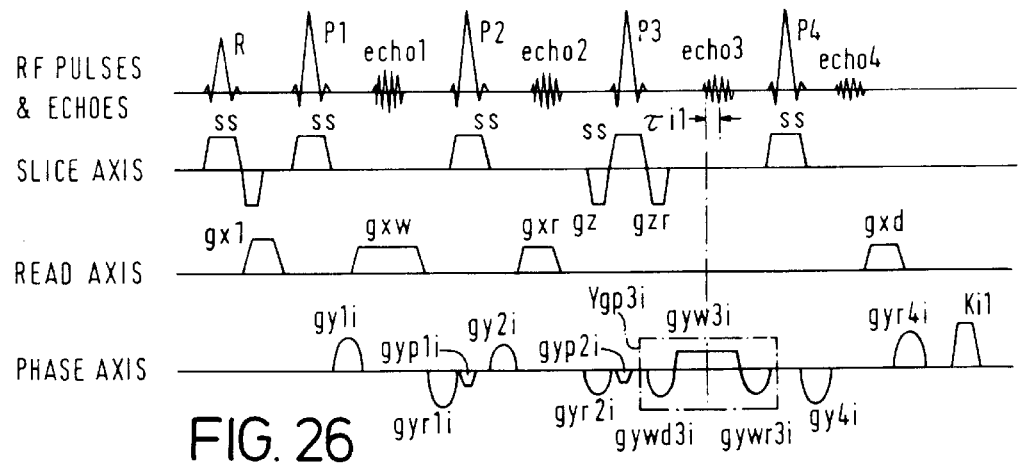
FIG. 26 is a diagram showing another example of the pulse sequence of pre-scanning based on the fourth embodiment.
Figure 27:
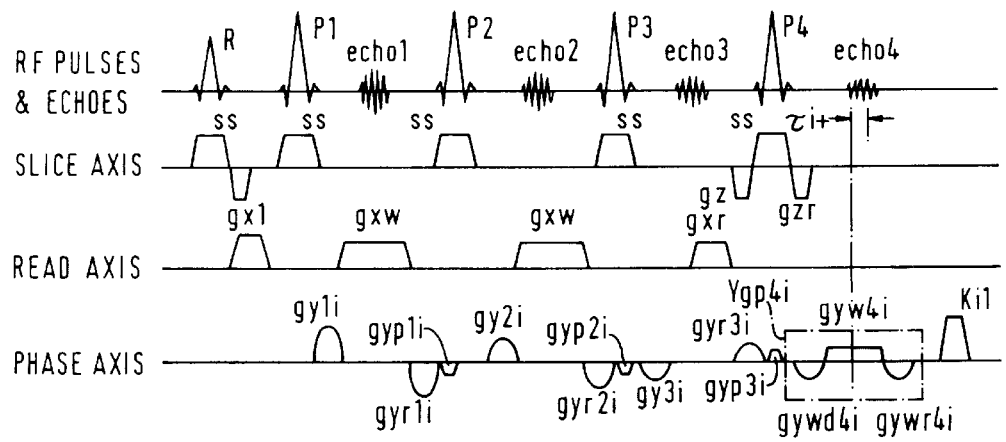
FIG. 27 is a diagram showing still another example of the pulse sequence of pre-scanning based on the fourth embodiment.

FIG. 26 shows an example of the pulse sequence of pre-scanning for K=3 and N=4, and FIG. 27 shows another example of the pulse sequence of pre-scanning for K=4 and N=4.

Step F2 to step F11 are repeated until K=N, and step F13 follows.

Step F13 repeats the above steps F1 through F12 for all values or proper values of repetition number i of the main scanning for imaging, and thereafter terminates the process.

In case the above steps F1 through F12 are repeated for all values of repetition number i of the main scanning for imaging, a compensation pulse gyp1i which is optimal for a number of encode gradients can be determined in exchange for a longer pre-scanning time.

Otherwise, in case the steps F1 through F12 are All repeated for certain values of i in a shorter pre-scanning time, compensation pulses gyp1i for remaining values of i must be calculated by interpolation from the gyp1i of the specific values of i, or must be substituted with the closest ones of the specific values of i.

Proper values of i are chosen by grouping gradient patterns such that those with the encode gradients gy1 to gyK of a same polarity pattern type are joined in one or more groups, i.e., those with the encode gradients gy1 to gyK of different polarity pattern types are grouped separately at least, and selecting a value of i relevant to an average encode gradient in each group.

Figure 28:
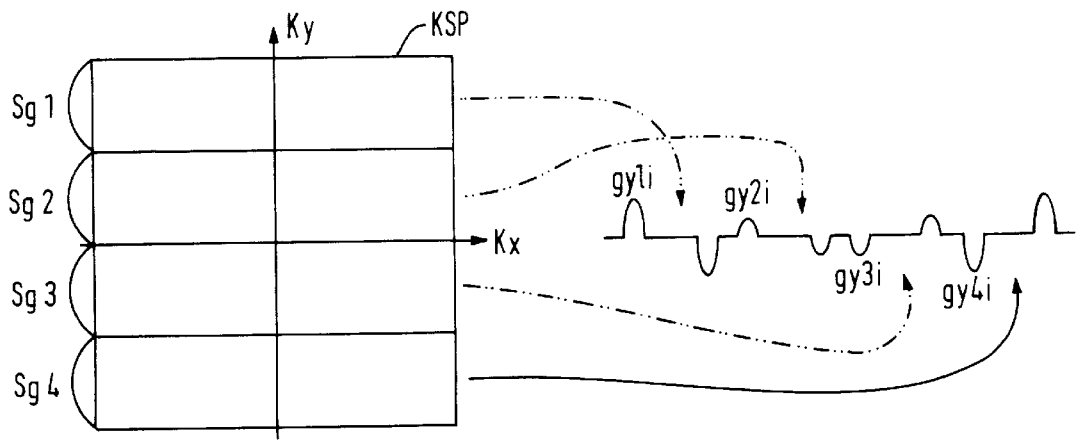
FIG. 28 is diagram used to explain the relation between segments and echos.
Figure 29:
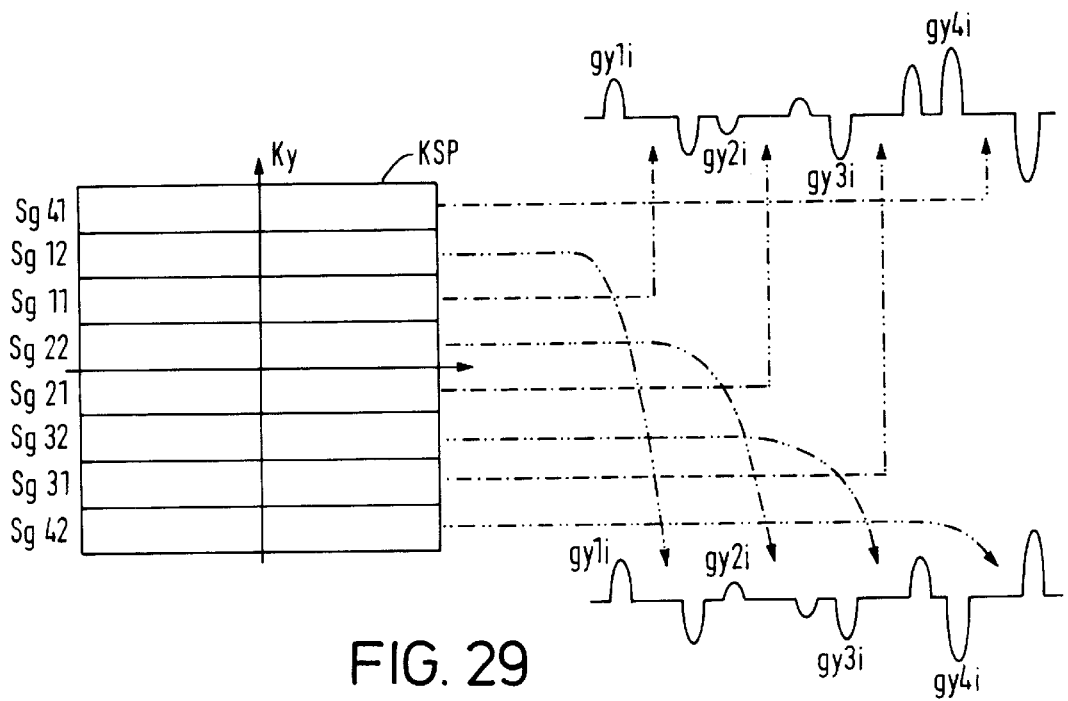
FIG. 29 is another diagram used to explain the relation between segments and echos.

FIG. 28 and FIG. 29 explain the manners of segmentation of the K-space KSP.

In the manner shown in FIG. 28, data of segments Sg1, Sg2, Sg3 and Sg4 are sampled from echo1, echo2, echo3 and echo4 by applying positive encode gradients gy1 and gy2 and negative encode gradients gy3 and gy4. In this case, there is only one type of encode gradient polarity pattern.

A correction value is determined for the polarity pattern of the positive encode gradients gy1 and gy2 and negative encode gradient gy3 and gy4. Preferably, the polarity pattern is divided into two or more groups, and correction values for values of i that represent these groups are determined.

In the manner shown in FIG. 29, data of segments Sg11, Sg21, Sg31 and Sg41 are sampled from echo1, echo2, echo3 and echo4 by applying a positive encode gradient gy1, negative encode gradients gy2 and gy3 and a positive encode gradient gy4. Furthermore, data of segments Sg12, Sg22, Sg32 and Sg42 are sampled from echo1, echo2, echo3 and echo4 by applying positive encode gradients gy1 and gy2 and negative encode gradients gy3 and gy4. In this case, there are two types of encode gradient polarity pattern.

A polarity pattern of the positive encode gradient cgy1, negative encode gradients gy2 and gy3 and positive encode gradient gy4, and another polarity pattern of the positive encode gradients gy1 and gy2 and negative encode gradients gy3 and gy4 are grouped separately at least, and correction values are determined for values of i that represent these groups. Preferably, each polarity pattern is divided into two or more groups, and correction values for values of i that represent these groups are determined.

Figure 30:
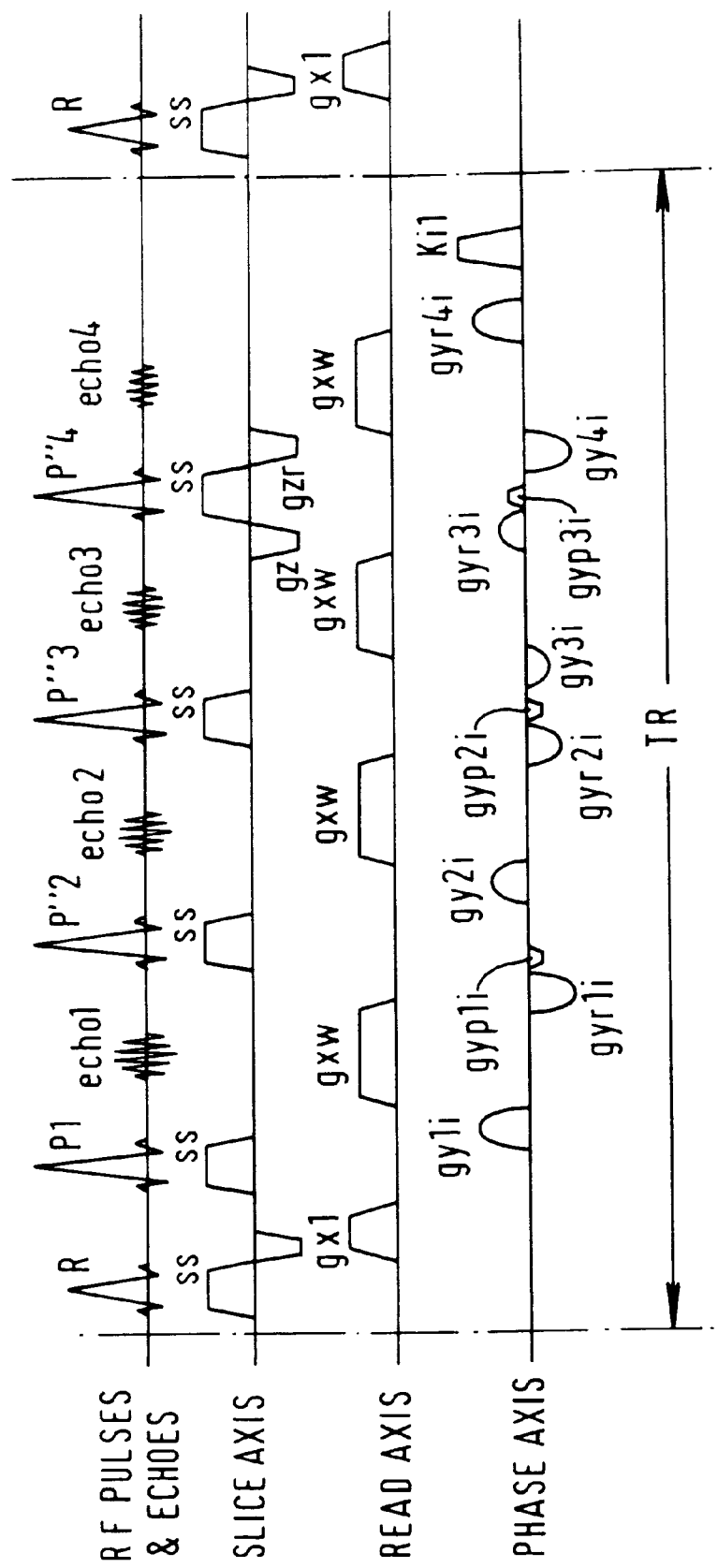
FIG. 30 is a diagram showing an example of the pulse sequence of high-speed SE method, with a compensation pulse being added at the end of each rewind gradient.

FIG. 30 shows an example of the pulse sequence of main scanning for imaging. This pulse sequence is designed to correct the 1st-order phase shift by adding compensation pulses gyp1i, gyp2i and gyp3i, which have been determined by the foregoing phase shift correction value determination process, to the end of the rewind gradients gyr1i, gyr2i and gyr3i of the pulse sequence of high-speed SE method. Inversion pulses P' with the rendition of an offset phase by the amount comparable to the 0th-order phase shift value $\Delta B0i$, which has been evaluated by the foregoing phase shift correction value determination process, are emitted thereby to correct the 0th-order phase shift.

As a variant of the pulse sequence, the compensation pulses gyp1i, gyp2i and gyp3i may be added to the front of the rewind gradients gyr1i, gyr2i and gyr3i of the pulse sequence of high-speed SE method. Alternatively, these compensation pulses may be added to the front and end of the rewind gradients gyr1i, gyr2i and gyr3i, or may be put in the rewind gradients gyr1i, gyr2i and gyr3i, or may be put in the encode gradients gy1i, gy2i and gy3i.

The the 0th-order phase shift may be corrected by rendering an offset phase by the amount comparable to $\Delta B0i$ to the detection phase of the phase detector 12, instead of emitting inversion pulses P'' with the rendition of an offset phase by the amount comparable to $\Delta B0i$.

Alternatively, the 0th-order phase shift may be corrected by the amount comparable to $\Delta B0i$ by rendering the offset phase to the detection phase of the phase detector 12, in addition to the emission of inversion pulses with the rendition of the offset phase.

In this manner, it is possible to prevent the deterioration of image caused by the inference of the eddy current and residual magnetization attributable to the encode gradient gy.

Embodiment 5

In contrast to the fourth embodiment which is intended to cancel the offset phase shift component, which emerges even if the encode gradient gy is "0", by evaluating the difference of phase shift values obtained from the phase-axis projection pulses Ypg(K-1)i of both polarities, it is also possible to cancel the offset phase shift by measuring the 1st-order term di0, with the encode gradient gy being set to "0", and subtracting it from the phase shift value.

Embodiment 6

In contrast to the preceding embodiments that are capable of determining the correction value accurately by expending a longer scanning time based on the use of the pulse sequence of pre-scanning similar to the pulse sequence of main scanning, the sixth embodiment is intended to reduce the scanning time in exchange for a lower accuracy of correction value.

Figure 31:
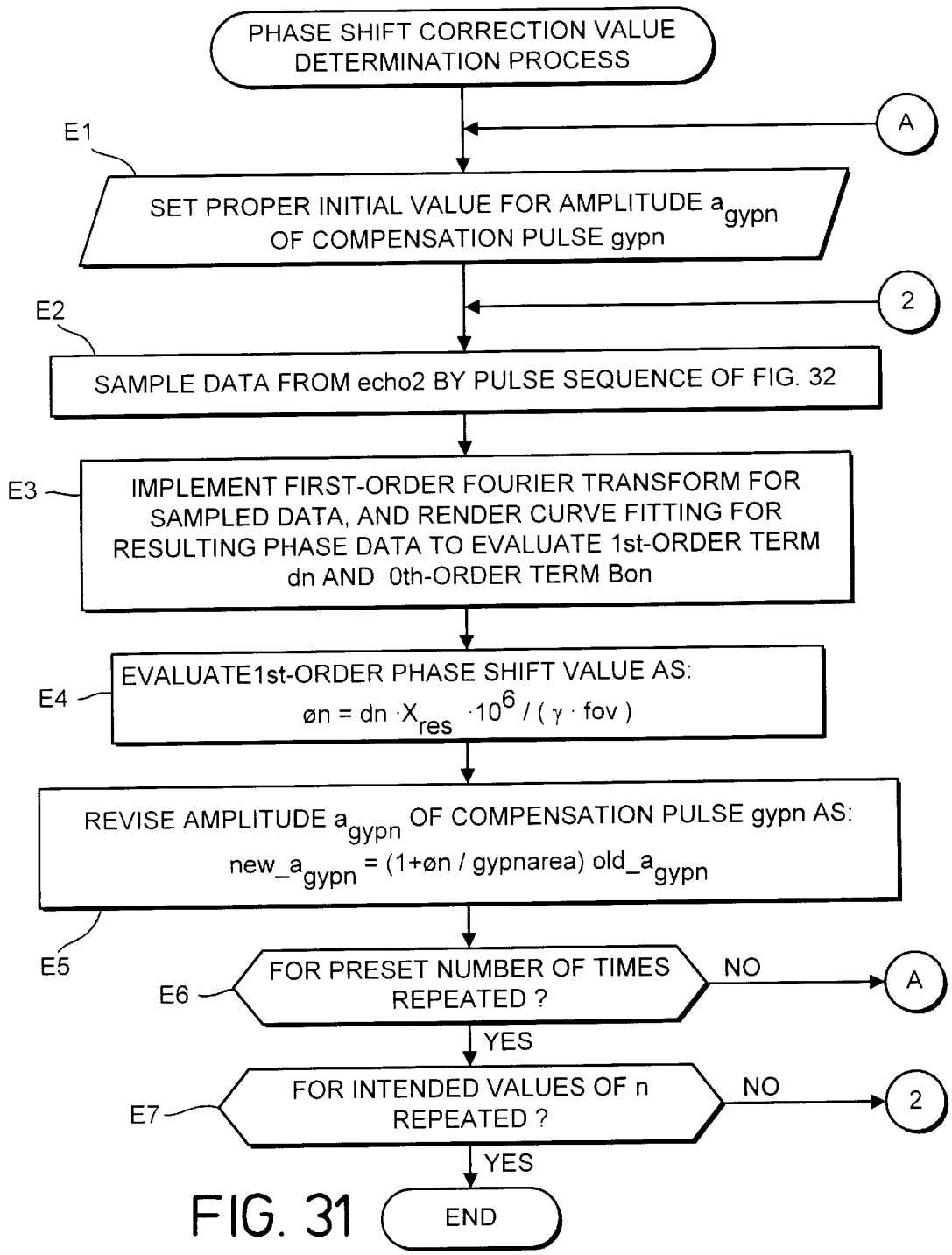
FIG. 31 is a flowchart showing the phase shift correction value determination process based on a sixth embodiment.

FIG. 31 shows by flowchart the phase shift correction value determination process of this embodiment.

Figure 32:
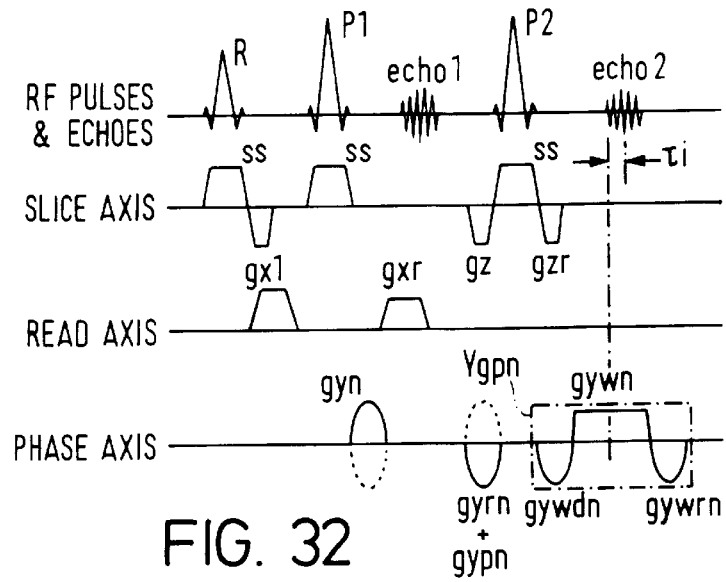
FIG. 32 is a diagram showing an example of the pulse sequence of pre-scanning based on the sixth embodiment.

Step E1 sets proper initial value for the amplitude $a_{gypn}$ of a compensation pulse gypn in the pulse sequence of pre-scanning shown in FIG. 32. The suffixal character "n" denotes the serial number of the encode gradient for which the correction value is to be determined.

Step E2 samples data from the echo2 based on the pulse sequence of FIG. 32.

In the pulse sequences of pre-scanning shown in FIG. 32, an excitation pulse R and a slice gradient ss are applied at the beginning. Next, a first inversion pulse P1 and a slice gradient ss are applied. Next, an encode gradient gyn for which correction value is to be determined is applied to the phase axis.

Next, a read gradient gxr, which is equal to the former half of the usual read gradient gxw, is applied. After that, the read gradient is kept "0". Next, a rewind gradient gyrn, with a compensation pulse having an equal time integral value and opposite polarity with respect to the encode gradient gyn being put therein, is applied to the phase axis.

Next, a second inversion pulse P2 and a slice gradient ss, with crusher gradients gz and gzr for eliminating stimulated echos being appended to the front and end thereof, are applied.

Next, a dephaser gradient gywdn which is identical to the rewind gradient gyrn is applied. Next, the NMR signal is received from the echo2 while applying a readout gradient gywn to the phase axis, and thereafter a rephaser gradient gywrn which is identical to the dephaser gradient gywdn is applied to the phase axis. A bunch of the dephaser gradient gywdn, readout gradient gywn and rephaser gradient gywrn are called "phase-axis projection pulse Ypgn".

Indicated by $\tau i$ in FIG. 32 signifies a time shift between the center of readout gradient gywn and the center of echo2. The time shift $\tau i$ represents the influence of the eddy current and residual magnetization attributable to the encode gradient gyn. The time shift $\tau i$ can be evaluated accurately as the 1st-order term of the phase of the result of first-order Fourier transform for the sampled data, and accordingly the influence of the eddy current and residual magnetization attributable to the encode gradient gyn can be known accurately.

Returning to FIG. 31, step E3 implements the first-order Fourier transform for the data sampled from the echo2, and renders the curve fitting for the resulting phase data based on the method of least squares or the like, thereby evaluating the 1st-order term dn and 0th-order term B0n.

Step E4 evaluates the 1st-order phase shift value on by the following formula:

$$\phi n = dn \cdot X_{res} \cdot 10^6 / (\gamma \cdot fov)$$

where $X_{res}$ is the number of sampling points of the echo2, $\gamma$ is the gyromagnetic ratio, and fov is the size of view field measured in cm.

Step E5 revises the amplitude $a_{gypn}$ of the compensation pulse gypn by the following formula:

$$\text{new}\_a_{gypn} = (1 + \phi i / gypnarea) \text{old}\_a_{gypn}$$

where new_$a_{gypn}$ is the revised amplitude, old_$a_{gypn}$ is the immediate amplitude, and gypnarea is the area of the immediate compensation pulse gypn (comparable to the dephase value).

Step E6 repeats the above steps E2 through E5 a preset number of times.

Step E7 repeats the above steps E1 through E7 for all values of n, and thereafter terminates the process.

In this manner, the correction value for the intended encode gradient gyn can be determined.

Embodiment 7

In contrast to the previous embodiment which uses the dephaser gradient gywdn and rephaser gradient gywrn and thus possibly yields a measurement result which is inconsistent with that of main scanning due to the influence of eddy current caused by them, the seventh embodiment is intended to determine the correction value without using the dephaser gradient gywdn and rephaser gradient gywrn.

Figure 33:
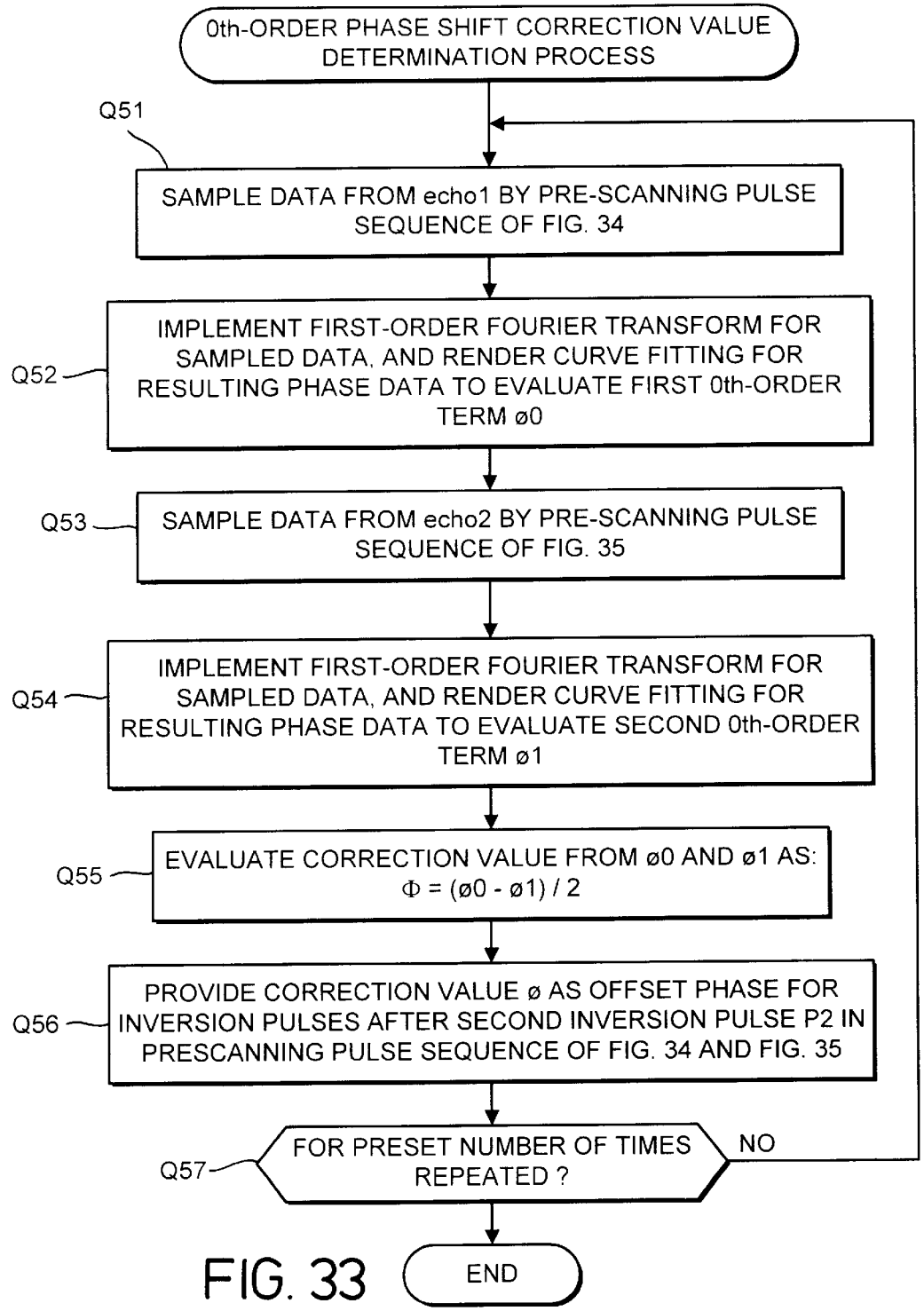
FIG. 33 is a flowchart showing the phase shift correction value determination process based on a seventh embodiment.

FIG. 33 shows by flowchart the phase shift correction value determination process of this embodiment.

Figure 34:
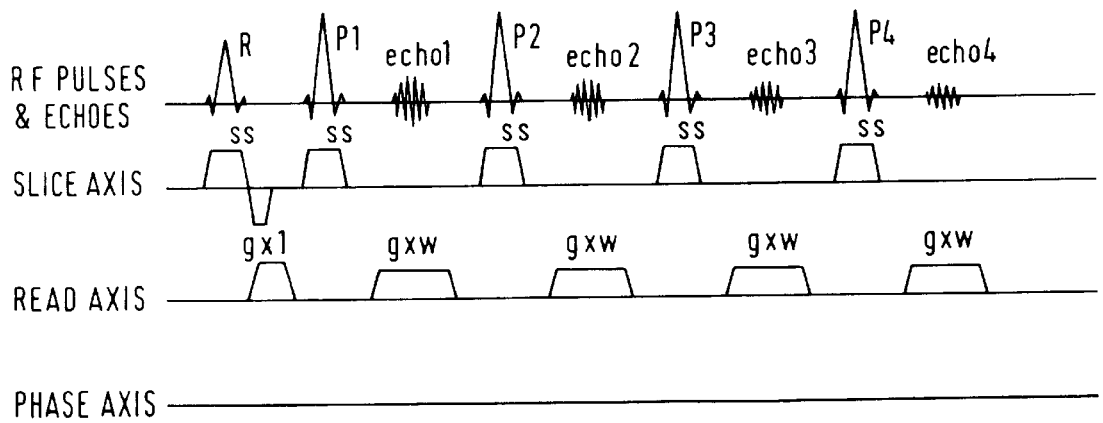
FIG. 34 is a diagram showing an example of the pulse sequence of pre-scanning based on the sixth embodiment.

Step Q51 samples data from the first echo echo1 based on the pulse sequence of FIG. 34.

In the pulse sequences of pre-scanning shown in FIG. 34, an excitation pulse R and a slice gradient ss are applied at the beginning. Next, a first inversion pulse P1 and a slice gradient ss are applied. Next, data is sampled from the echo1 while applying a read gradient gxw, but without applying a gradient to the phase axis.

Returning to FIG. 33, step Q52 implements the first-order Fourier transform for the sampled data, and renders the curve fitting for the resulting phase data, thereby recognizing the phase at the point of "0" gradient field to be the first 0th-order term $\phi 0$.

Figure 35:
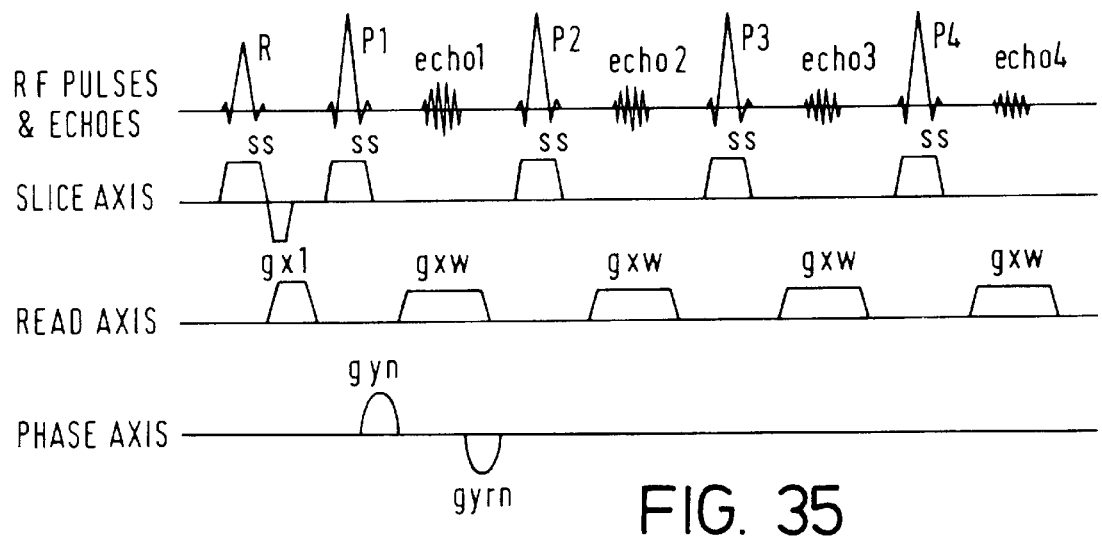
FIG. 35 is a diagram showing another example of the pulse sequence of pre-scanning based on the sixth embodiment.

Step Q53 samples data from the second echo echo2 based on the pulse sequence of FIG. 35.

In the pulse sequences of pre-scanning shown in FIG. 35, an excitation pulse R and a slice gradient ss are applied at the beginning. Next, a first inversion pulse P1 and a slice gradient ss are applied. Next, an encode gradient gyn for which the correction value is to be determined is applied to the phase axis. Next, a read gradient gxw is applied. Next, a rewind gradient gyrn having an equal time integral value and opposite polarity with respect to the encode gradient gyn is applied to the phase axis. Next, a second inversion pulse P2 and a slice gradient ss are applied. Next, data is sampled from the echo2 while applying a read gradient gxw.

Returning to FIG. 33, step Q54 implements the first-order Fourier transform for the sampled data, and renders the curve fitting for the resulting phase data, thereby recognizing the phase at the point of "0" gradient field to be the second 0th-order term $\phi 1$.

Step Q55 evaluates the correction value $\Phi$ from the first 0th-order term $\phi 0$ and second 0th-order term $\phi 1$ as: $\Phi=(\phi 0-\phi 1)/2$.

Figure 36:
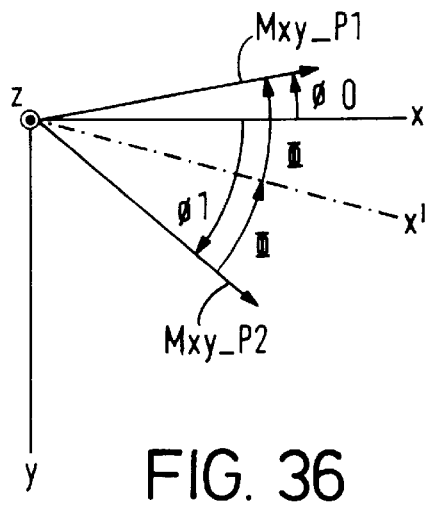
FIG. 36 is a diagram used to explain the principle of correction value calculation based on the sixth embodiment.

FIG. 36 shows the principle of this calculation. It is assumed that magnetization Mxy__P1 following the application of the first inversion pulse P1 in the pulse sequence of pre-scanning in FIG. 34 does not coincide with the rotation axis x by some reason, but has an angle of $\phi 0$ with the rotation axis x in the counterclockwise direction. It is further assumed that the rotation axis x moves to x' due to the inference of the eddy current caused by the encode gradient gyn and rewind gradient gyrn which have been applied to the phase axis by the pulse sequence of pre-scanning shown in FIG. 35.

The angle $\phi 0$ is observed as the first 0th-order term. After the application of the first inversion pulse P1 by the pulse sequence of pre-scanning shown in FIG. 35, magnetization is still Mxy__P1, and therefore magnetization Mxy__P2 following the application of the second inversion pulse P2 has the angle of the magnetization Mxy__P1 with the rotation axis x'. The second 0th-order term $\phi 1$ signifies the phase of the magnetization Mxy__P2 measured in the clockwise direction from the rotation axis x.

Accordingly, the term $\phi 0-\phi 1$ indicates the phase of the magnetization Mxy__P1 measured in the clockwise direction from the magnetization Mxy__P2. The term $(\phi 1-\phi 1)/2$ indicates the phase of the magnetization Mxy__P1 measured in the clockwise direction from the rotation axis x', as will be appreciated from FIG. 36.

With this phase $\Phi$ being the correction value, it is equivalent to the movement of the rotation axis x', which has moved by the influence of the eddy current caused by the encode gradient gyn and rewind gradient gyrn, to the angle of the magnetization Mxy__P1. Namely, the rotation axis becomes coincident with the magnetization Mxy__P1, and the magnetization Mxy__P2 following the application of the inversion pulse P2 coincides with the magnetization Mxy__P1, resulting in the cancellation of the inference of the eddy current caused by the encode gradient gyn and rewind gradient gyrn.

Returning to FIG. 33, step Q56 provides the correction value $\Phi$ as an offset phase for inversion pulses after the second inversion pulse P2 in the pre-scanning pulse sequence of FIG. 34 and FIG. 35.

Step Q57 repeats the steps Q51 through Q56 a preset a number of times thereby to settle the optimal correction value $\Phi$ and thereafter terminates the process.

In this manner, the correction value can be determined for the intended encode gradient gyn.

Many widely different embodiments of the invention may be constructed without departing from the spirit and scope of the present invention. It should be understood that the present invention is not limited to the specific embodiments described in the specification, except as defined in the appended claims.

What is claimed is:

1. A split echo train method of phase shift correction, comprising the steps of:

emitting an excitation pulse;

emitting an inversion pulse;

applying an encode gradient to a phase axis, said encode gradient comprising a former part encode gradient and a latter part encode gradient;

applying a read gradient to a read axis, said read gradient comprising a former part read gradient and a latter part read gradient;

sampling data from a plurality of echoes comprising a former part echo and a latter part echo;

applying a rewind gradient to said phase axis;

repeating the foregoing steps a plurality of times;

producing a first image based on sampled data from said former part echo and a second image based on sampled data from said latter part echo; and correcting first order phase shift of said latter part echo caused by said former part or preceding encode gradient and said rewind gradient, by placing a compensation pulse before said former part echo and at a position selected from the group consist of immediately before said encode gradient, in said encode gradient, immediately following said encode gradient, immediately before said rewind gradient, in said rewind gradient, and immediately following said rewind gradient.

2. The method of claim 1, wherein said correcting step comprises determining a correction value for said compensation pulse based on a phase shift value measurement.

3. The method of claim 1, wherein said encode gradient comprises separating said former part encode gradient into separate groups of different types of polarity patterns;

determining a correction value for one or more encode gradients representing said separate groups; and determining a correction value for one or more encode gradients not of said separate groups, based on calculation of correction values for said one or more encode gradients of said separate groups.

4. The method of claim 3, wherein said different polarity patterns of said encode gradients are measured, and wherein for encode gradients of the same polarity, a phase shift value resulting from measurements are used to balance reduction of pre-scanning and accuracy of correction.

5. The method of claim 1, wherein said compensation pulse has a correction value which results in a correction of said first order phase shift and is determined by a preset phase shift value.

6. The method of claim 1, wherein a dephaser gradient is applied to said phase axis, and a compensation pulse is applied for a second echo.

7. The method of claim 1, wherein said compensation pulse is added to the end of a last former part rewind gradient and an inversion pulse is emitted to provide an offset phase to correct said first order phase shift.

8. The method of claim 1, wherein said compensation pulse is added to the front of a last former part rewind gradient and an inversion pulse is emitted to provide an offset phase thereby to correct said first order phase shift.

9. The method of claim 1, wherein said compensation pulse is added to the last former part rewind gradient and an inversion pulse is emitted to provide an offset phase thereby to correct said first order phase shift.

10. The method of claim 1, wherein said compensation pulse is added to the last former part encode gradient and an inversion pulse is emitted to provide an offset phase thereby to correct said first order phase shift.

11. The method of claim 1, wherein a plurality of compensation pulses are added at the ends of a plurality of rewind gradients and a plurality of inversion pulses are emitted thereby to provide an offset phase to correct said first order phase shift.

12. A method fo phase shift correction comprising the steps of:

emitting an exciting pulse;

emitting an inversion pulse comprising a latter part inversion pulse;

applying an encode gradient to a phase axis, said encode gradient comprising a former part encode gradient and a latter part encode gradient;

applying a read gradient to a read axis;

sampling data from a plurality of echoes;

applying a rewind gradient to said phase axis;

repeating the foregoing steps a plurality of times;

producing an image based on data sampled from said echoes; and correcting a phase shift of said echoes caused by said former part encode gradient and said rewind gradient, by providing an offset phase at a point in time where said latter part inversion pulse is applied or where said plurality of echoes are detected.

13. The method of claim 12, wherein said offset phase has a a value obtained by measurement.

14. The method of claim 12, wherein said former part encode gradient is separated into separate groups according to types of polarity patterns, and said phase shift value is determined by classification of the separate groups.

15. The method of claim 12, wherein said inversion pulse is emitted in addition to said offset phase being placed in said detection phase.

16. The method of claim 12, wherein two phase axis projection pulses are used and a difference in phase shift values is obtained therefrom thereby to cancel a component of said offset phase.

17. The method of claim 12, wherein said offset phase is obtained by measuring a first order term with an encode gradient being set to zero and then subtracting same from the phase shift value.

* * * * *